United States Patent [19]
Stumbo

[11] Patent Number: 6,133,987
[45] Date of Patent: Oct. 17, 2000

[54] TECHNIQUE FOR REDUCING PATTERN PLACEMENT ERROR IN PROJECTION ELECTRON-BEAM LITHOGRAPHY

[75] Inventor: David P. Stumbo, Belmont, Calif.

[73] Assignee: Nikon Corporation, Belmont, Calif.

[21] Appl. No.: 09/177,675

[22] Filed: Oct. 22, 1998

[51] Int. Cl.$^7$ .............................. G03B 27/54; G21K 5/10

[52] U.S. Cl. ........................................ 355/67; 250/492.22

[58] Field of Search .......................... 355/67; 250/491.1, 250/491.2, 492.3, 492.22; 430/296, 5, 30

[56] References Cited

U.S. PATENT DOCUMENTS

| | | | |
|---|---|---|---|
| 4,410,879 | 10/1983 | Gumm et al. | 340/347 DA |
| 4,430,642 | 2/1984 | Weigland et al. | 340/347 DA |
| 4,583,077 | 4/1986 | Yasuda et al. | 340/347 DA |
| 4,998,108 | 3/1991 | Ginthner et al. | 341/145 |
| 5,153,592 | 10/1992 | Fairchild et al. | 341/118 |
| 5,345,085 | 9/1994 | Prior | 250/491.1 |

OTHER PUBLICATIONS

IBM Technical Disclosure Bulletin vol. 24, No. 9 Feb. 1982 pp. 4784–4785.

*Primary Examiner*—Safet Metjahic
*Assistant Examiner*—Peter B. Kim

[57] ABSTRACT

Electron-beam lithography systems used for transferring images from subfields in a reticle to a wafer. Deflection systems in the electronic lens system are controlled by control systems that include devices to correct misalignment of the electron beams from each of the subfields with the electronic optical axis. In a first embodiment, switches switch between sources to deflect the electron beams to the electronic optical axis and error DACs correct position errors in the sources that are input to the switches. In a second embodiment, the deflection systems deflect the electronic optical axis to coincide with the electron beams from the subfields. In other embodiments, the deflection systems in the electronic lens systems are made insensitive to position errors in deflection control systems by satisfying the condition: $G_1/G_2=M$, where $G_1$ is the gain of first amplifier amplifying a signal from a DAC which is input to the deflection system deflecting the electron beams from the subfields, $G_2$ is the gain of a second amplifier amplifying the signal from the DAC which is input to the deflection system deflecting the electron beams to the wafer and M is the magnification of the electronic lens system. Alternatively, the deflection systems deflect the electronic optical axis to coincide with the electron beams from the sub fields. A grillage error DAC supplies a position correction to account for grillage between the subfields. In still other embodiments, a ramp generator supplies a ramp that is input to the deflection systems that are insensitive to position errors in deflection control systems by satisfying the condition: $G_1/G2=M$.

24 Claims, 16 Drawing Sheets

TECHNIQUE FOR REDUCING PATTERN PLACEMENT ERROR IN PROJECTION ELECTRON-BEAM LITHOGRAPHY

FIELD OF THE INVENTION

This invention relates generally to projection electron-beam lithography systems. More specifically this invention relates to a technique to reduce pattern placement errors in projection electron-beam lithography systems.

BACKGROUND OF THE INVENTION

Because there is a continuing requirement to increase the integration density of integrated circuits, new techniques for creating a pattern on a surface such as the surface of a semiconductor wafer have been developed. One such technique utilizes an electron-beam lithography system in which electrons are directed onto the surface of a semiconductor wafer to expose an electron sensitive resist coating on the surface of the semiconductor wafer. After exposure and development, the resulting resist pattern is used as a template to effect patterned modifications on or to the underlying semiconductor material.

The classic electron-beam lithography system is the "probe-forming" system in which a narrow beam of electrons that is the image of the electron source and having a Gaussian distribution is scanned over the surface to be exposed. The narrow beam is scanned a pixel at a time, the pixel being defined as the full width at half height of the beam intensity distribution. These systems can have the highest spatial resolution, but also have the lowest throughput of all electron-beam lithography systems due to the serial exposure of patterns one pixel at a time. One advantage of systems that serially expose patterns is that corrections can be applied dynamically, pixel by pixel, to compensate for aberrations of the electron lenses and deflection units in the system. Another advantage is that if the pixel represents the smallest feature of the desired pattern, a pattern of any arbitrary complexity can be created with this type of probe. A further advantage is that proximity corrections are also easily made with this type of probe.

An increase in throughput can be achieved by producing a larger spot on the wafer, adjustable in size and shape, so that it is equal to or greater than the minimum feature size of the circuit. Electron-beam lithography systems with this feature create a shaped spot on the wafer by generating an image of apertures or other objects illuminated by the source, that is, not an image of the source itself. In these types of electron-beam lithography systems, the image is electronically variable in size and adjustable to compose a pattern feature with serial exposures projecting up to several hundred pixels in parallel.

An increase in throughput can also be achieved by providing a mask (reticle) through which a beam of electrons is directed and electronically focused onto the surface of the semiconductor wafer. As is known in the semiconductor manufacturing art, the reticle has a pattern formed thereon that describes the features of the circuit or structure that is to be formed on the semiconductor wafer. Because the size of the reticle far exceeds the field of view of the electronic lenses that are available, it is necessary to direct the electron beam onto a portion of the reticle and then move (step or scan) the electron beam sequentially to other portions of the reticle. To facilitate this procedure, the reticle is divided into subfields and each subfield is illuminated one at a time by sequentially stepping or scanning the electron beam from one subfield to the next until the pattern on the reticle has been completely transferred by an electronic projection lens system onto the surface of the semiconductor wafer. Alternatively, the reticle may be moved so that other portions of the reticle are sequentially illuminated by the electron beam.

Because of the increase in the integration density of the integrated circuits on semiconductor wafers, the positional accuracy of the electronic systems for transferring the pattern from the reticle to the wafer has approached and has exceeded the practical limitations of available electronic equipment.

Accordingly, there is a need for an electronic system that utilizes available electronic equipment to accurately position the electron beam on the semiconductor wafer that is cost-effective and that does not degrade throughput of the lithography system.

SUMMARY OF THE INVENTION

The present invention overcomes the above problems and provides other additional advantages through electron-beam lithography systems that transfer images from subfields in a reticle to a semiconductor wafer and that position electron beams emerging from the subfields onto a semiconductor wafer with an accuracy in the range of 1 nanometer.

In accordance with a first aspect of the invention, deflection systems in the electronic lens system in the electron-beam lithography systems are controlled by inputs switched by first and second switches and position errors in the inputs are corrected by inputs from error tables. The deflection systems can either deflect electron beams emerging from subfields in the reticle to coincide with an electronic optical axis or deflect the electronic optical axis to coincide with the electron beams. The input from the first switch either deflects the electron beams or the electronic optical axis to within a range $R_R$ in accordance with the following condition:

$M \cdot A \cdot 2^B = R_R$, where M is the magnification of the electronic lens system, A is the desired accuracy of the electron-beam lithography system at the wafer, B is accuracy of an error DAC that corrects the position error in the inputs, and $R_R$ is the range within which the input from the first switch is designed to deflect either the electron beams or the electronic optical axis. The input from the second switch either deflects the electron beams or the electronic optical axis to within a range $R_W$ in accordance with the following condition:

$A \cdot 2^B = R_W$, where $R_W$ is the range within which the input from the first switch is designed to deflect either the electron beams or the electronic optical axis. The desired accuracy of the electron-beam lithography system is in the range of 0.5 to 100 nanometers and the accuracy of the error DACs is in the range of 8 bits to 18 bits.

In accordance with a second aspect of the invention, deflection systems in the electronic lens system in electron-beam lithography systems are controlled by inputs from a main DAC. The output of the main DAC is amplified by a first amplifier with a gain $G_1$ and input to a first deflection system that either deflects electron beams emerging from subfields in the reticle to coincide with an electronic optical axis or deflects the electronic optical axis to coincide with the electron beams. The output of the main DAC is amplified by a second amplifier with a gain $G_2$ and input to a second deflection system that either deflects electron beams to coincide with the electronic optical axis or deflects the electronic optical axis to coincide with the electron beams. The electronic lens system is insensitive to position errors in the main DAC when the following condition is satisfied:

$G_1/G2=M$, where M is the magnification of the electronic lens system. In another aspect of these embodiments of the present invention, in order to account for grillage between the subfields, inputs are summed with inputs from a grillage error DAC that has inputs from an error table. The sum is amplified by a third amplifier and the output of the third amplifier is summed with the output of the first amplifier and input to the first deflection system.

In accordance with a third aspect of the invention, deflection systems in the electronic lens system in electron-beam lithography systems are controlled by an input from a ramp generator with an output that is amplified by a first amplifier having a gain $G_1$ and input to a first deflection system that either deflects electron beams emerging from subfields in the reticle to coincide with an electronic optical axis or deflects the electronic optical axis to coincide with the electron beams. The output of the ramp generator is amplified by a second amplifier with a gain $G_2$ and input to a second deflection system that either deflects the electron beams to coincide with the electronic optical axis or deflects the electronic optical axis to coincide with the electron beams. The electronic lens system is insensitive to position errors in the ramp generator when the following condition is satisfied:

$G_1/G_2=M$, where M is the magnification of the electronic lens system.

These and other advantages of the present invention will become more apparent upon a reading of the detailed description of the preferred embodiment or embodiments that follow, when considered in conjunction with the drawings of which the following is a brief description. It should be clear that the drawings are merely illustrative of the currently preferred embodiments of the present invention, and that the invention is in no way limited to the illustrated embodiments. As will be realized, the invention is capable of other embodiments and its several details are capable of modifications in various obvious aspects, all without departing from the scope of the invention. The present invention is best defined by the claims appended to this specification.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

The following detailed description is of the presently preferred embodiments of the present invention. It is to be understood that while the detailed description is given utilizing the drawings briefly described above, the invention is not limited to the illustrated embodiments. In the detailed description, like reference numbers refer to like elements. It is noted that it is common practice for optical terms to be used in describing electron-beam lithography systems, thus, terms such as "lens" and "optical axis" are used to describe features of an electron-beam lithography system.

Referring now to the Figures, the several embodiments of the present invention will now be described.

Figure 1:
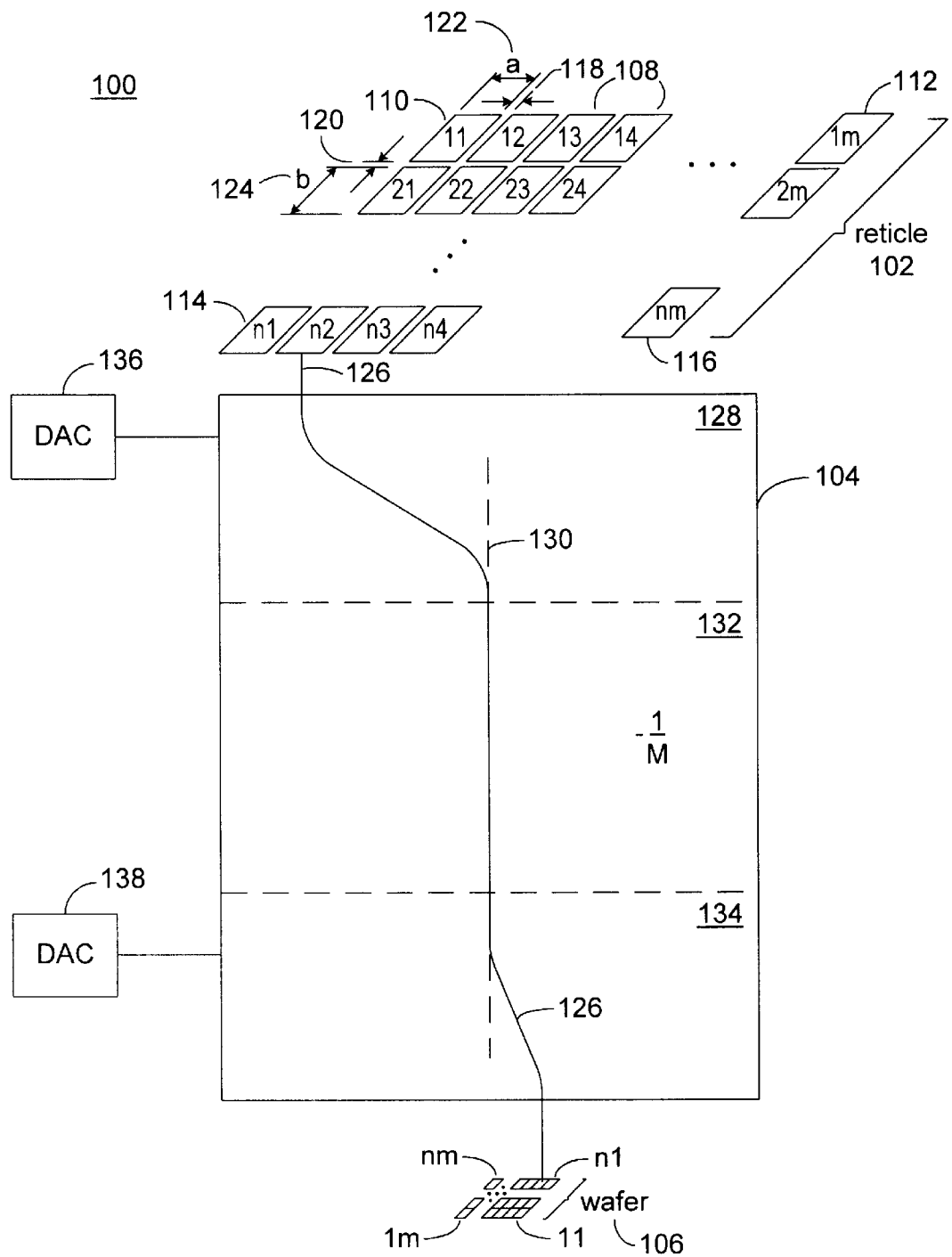
FIG. 1 illustrates a portion of a projection electron-beam lithography system in which images of subfields on a reticle are transferred to a semiconductor wafer by an electron beam via an electronic lens system.

FIG. 1 illustrates a portion of a projection electron-beam lithography system 100 showing a portion of a reticle 102, an electronic lens system 104 and a portion of a semiconductor wafer 106. The reticle 102 is divided into subfields such as those indicated at 108. For convenience, the subfields 108 have been given a notation of "nm" where "n" is the number of rows and "m" is the number of columns. The first subfield 110 is then denoted as 11 and the last subfield 112 in the first row would be denoted as 1m and the last subfield 114 in the first column would be denoted as n1. The last subfield 116 in the last row and last column would be denoted as nm. The subfields 108 can be separated by "grillage" that are extra bars of blank material between the subfields. The columnar grillage "g" is shown at 118 and the grillage separating the rows is shown at 120. It is noted that the columnar grillage can be different than the row grillage. The width "a" of the subfields is shown at 122 and the height "b" of the subfields is shown at 124. The width "a" and the height "b" can be equal or different. Typical values for the width and height is 1 millimeter and for the grillage is 0.3 millimeters. It should be appreciated that other widths and heights and grillage values can be used and the use of 1 millimeter for width and height and 0.3 millimeters for the grillage are for illustrative purposes only.

In FIG. 1, there is shown a representation of an electron beam 126 emerging from a subfield n2 of the reticle 102 and entering the electronic lens system 104. A first section 128 of the electronic lens system 104 includes a deflection system that deflects the electron beam 126 emerging from the reticle 102 to coincide with the electronic optical axis 130 of the electronic lens system 104. A second section 132 of the electronic lens system 104 includes a magnification lens system that demagnifies the beam 126 emerging from the first section 128 of the electronic lens system 104. A third section 134 of the electronic lens system 104 includes a deflection system that deflects the demagnified beam 126 emerging from the second section 132 of the electronic lens system 104 to the appropriate region on the wafer 106. It should be appreciated that the magnification section 132 can be coincident with one or both of the deflection sections 128 and 134.

The gain of the magnification lens system in the second section 132 typically has a value of −1/M where M is typically a value such as 4. The minus indicates that the image is inverted from top to bottom and from right to left. Therefore, the image on the wafer 106 is inverted from top to bottom and from right to left. The deflection system in section 128 of the electronic lens system 104 can be controlled by a DAC (Digital to Analog Converter) 136 and the deflection lens system in section 134 of the electronic lens system 104 can also be controlled by a DAC 138. As will be appreciated by a person of ordinary skill in the art, the various components are further controlled by a central processing unit (cpu) not shown. Such a cpu would coordinate the functions described above. Such a unit is not part of the present invention and will not be shown or discussed.

Figure 2A:
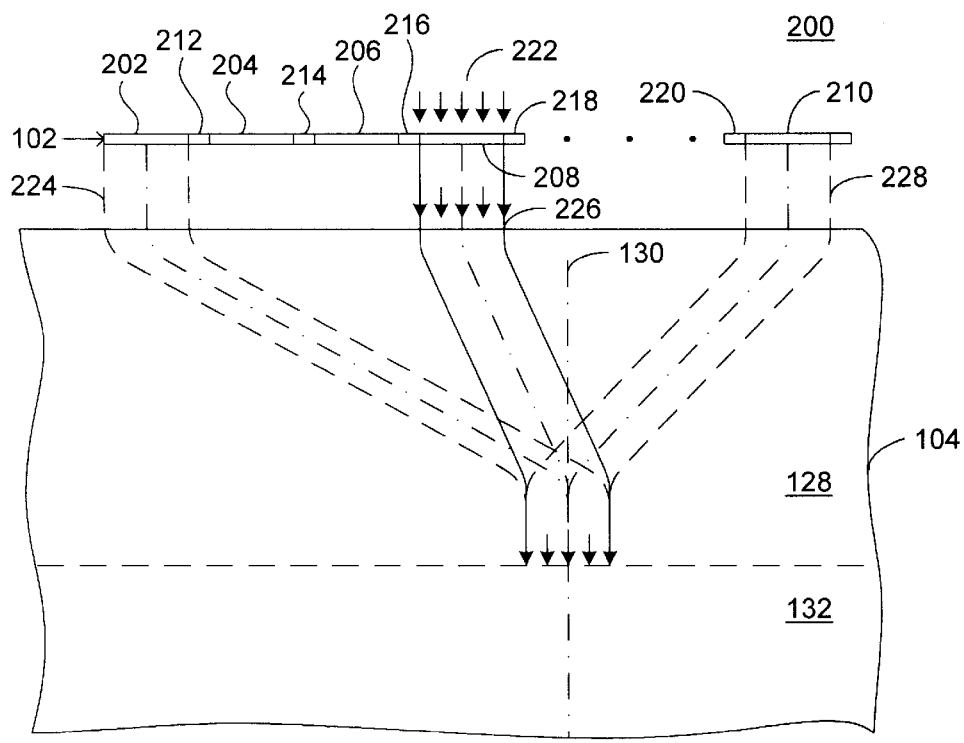
FIG. 2A illustrates a portion of a projection electron-beam lithography showing a portion of a reticle and an electron beams emerging from subfields on the reticle being deflected by a deflection system to the electronic optical axis of the electronic lens system.

FIG. 2A illustrates a portion 200 of the projection electron-beam lithography system 100 shown in FIG. 1. Subfields of the reticle 102 are shown at 202, 204, 206, 208, and 210. The grillage between the subfields 202, 204, 206, 208, and 210 are shown at 212, 214, 216, 218 and 220. A beam of electrons 222 is shown being directed onto the subfield 208. Typically, a projection electron-beam lithography system has a source of electrons that emits a beam of electrons that is shaped by an electronic shaping system (not shown) into a collimated electron beam that is slightly larger than the subfields that are to be illuminated by the electron beam. An electronic deflection system (not shown) then sequentially deflects the shaped electron beam onto the appropriate subfield. As should be appreciated, the electron beam 222 is moved from subfield to subfield, typically from a first end of a row to the second end of the row at which time the electron beam can either be returned to the first end of the next row until all the rows have been illuminated or the electron beam can describe a serpentine path through the successive rows, that is, when one row is finished, the electron beam is stepped to the next row and is moved in the opposite direction until all the rows have been illuminated. It should be appreciated that any other illumination pattern of the reticle can be used. Alternatively, the reticle may be moved so that subfields on the reticle are being illuminated by the shaped electron beam.

When the subfield 202 in FIG. 2A is being illuminated, the electron beam 224 emerging from the subfield 202 is deflected by the deflection system 128 to the electronic optical axis 130 of the electronic lens system 104. It should be appreciated that it is necessary for the electron beam from each of the subfields to be deflected to the electronic optical axis 130 of the electronic lens system 104 in order to minimize aberrations and distortion of the electron beam emerging from each of the subfields on the reticle 102. The aberrations and distortion of the electron beam typically increase if the electron beam is not centered on the electronic optical axis 130 of the electronic lens system 104. Similarly, the electron beams 226 and 228 emerging from subfields 208 and 210, respectively, must be accurately deflected to be centered on the electronic optical axis 130 of the electronic lens system 104.

Figure 2B:
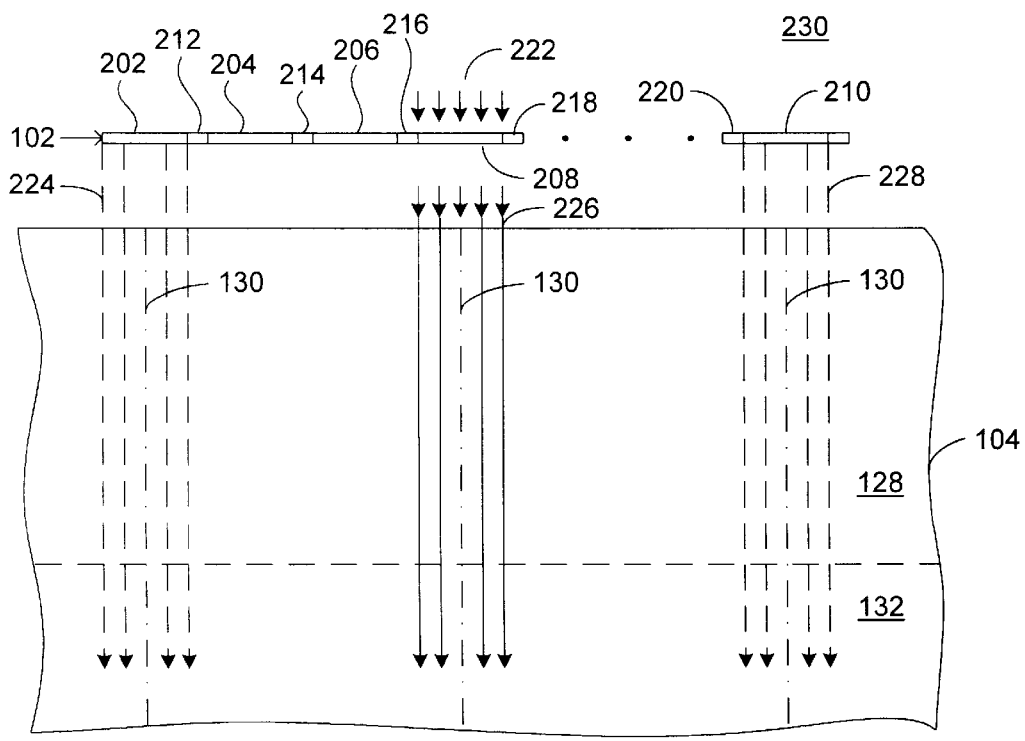
FIG. 2B illustrates a portion of a projection electron-beam lithography system showing a portion of a reticle and the electronic optical axis of the electronic lens system being deflected to coincide with the centerlines of the electron beams emerging from subfields on the reticle.

FIG. 2B illustrates a portion 230 of a projection electron-beam lithography system singular to the one shown in FIG. 1. The portion 230 of the projection electron-beam lithography system shows the subfields of the reticle 102 at 202, 204, 206, 208 and 210. The grillage between the subfields 202, 204, 206, 208 and 210 are shown at 212, 214, 216, 218 and 220. A beam of electrons 222 is shown being directed onto the subfield 208. The beam of electrons 226 emerging from the subfield 208 is shown coincident with the electronic optical axis 130. When the electron beam 222 is directed onto subfield 202, the electronic optical axis 130 is moved to be coincident with the electron beam 224 emerging from the subfield 202. Similarly, when the electron beam 222 is directed onto subfield 210 and other subfields, the electronic optical axis 130 is moved to be coincident with the electron beam 228 emerging from the subfield 210 and the other subfields.

Figure 3A:
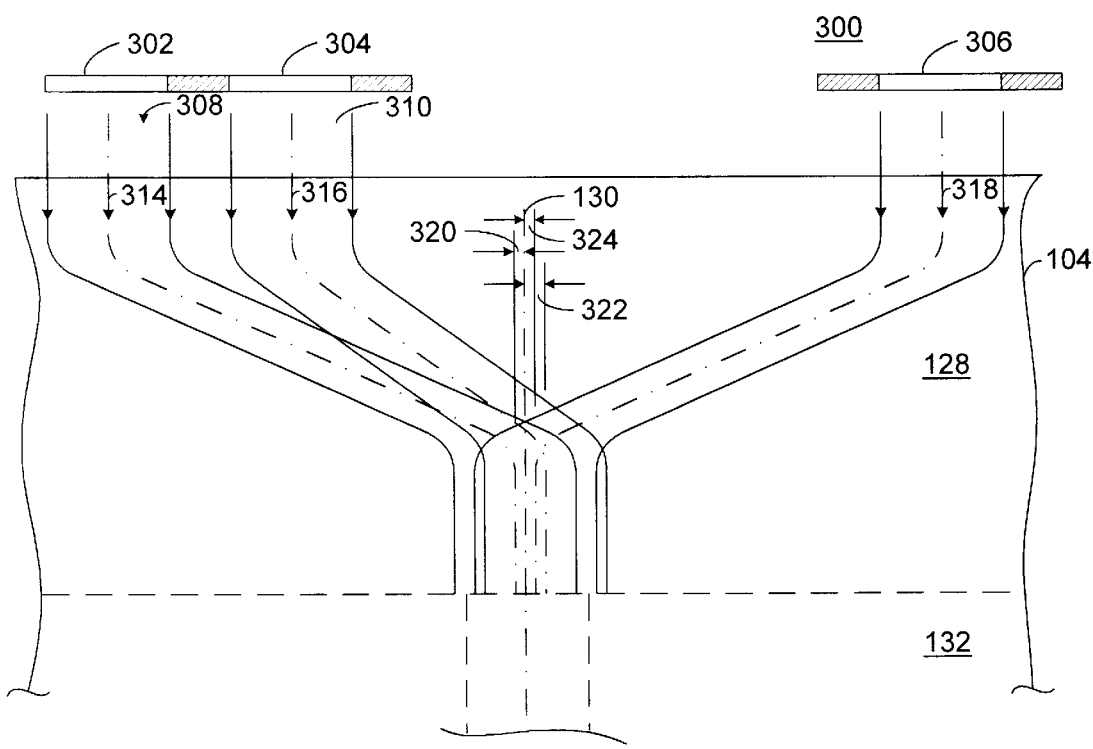
FIG. 3A illustrates in more detail a portion of the projection electron-beam lithography system shown in FIG. 2A showing subfields on the reticle and position errors caused by a misalignment of the centerline of the electron beams emerging from the subfields with the electronic optical axis of the electronic lens system.

FIG. 3A illustrates a portion 300 of the projection electron-beam lithography system 200 shown in FIG. 2A. Three subfields 302, 304, and 306 of the reticle 102 are shown with electron beams 308, 310 and 312 emerging from the subfields 302, 304, and 306, respectively. Each of the electron beams 308, 310 and 312 have a centerline 314, 316 and 318, respectively. For minimum distortion of the electronic beams caused by aberrations it is necessary that each of the centerlines 314, 316 and 318 of the electron beams 308, 310, and 312, respectively, coincide with the electronic optical axis 130 of the projection lens system 104. For illustrative purposes, the centerline 314 of electron beam 308 is shown misaligned with the electronic optical axis 130 of the projection lens system 104. The amount of the misalignment is shown at 320. Similarly, the centerlines 316 and 318 of electron beams 310 and 312, respectively, are shown misaligned with the electronic optical axis 130 of the projection lens system 104. The misalignment of centerline 316 is shown at 322 and the misalignment of centerline 318 is shown at 324. As can be appreciated, each of the beams emerging from each subfield in the reticle may have misalignments that must be corrected.

Figure 3B:
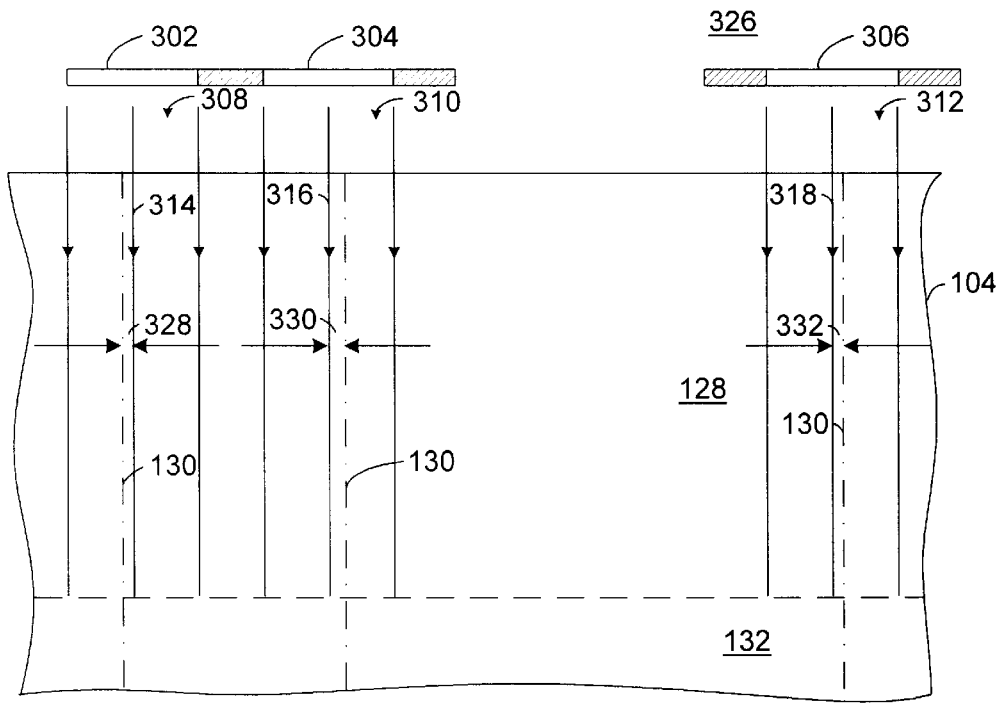
FIG. 3B illustrates in more detail a portion of the projection electron-beam lithography system shown in FIG. 2B showing subfields on the reticle and position errors caused by misalignment of the electronic optical axis with the centerline of the electron beams emerging from the subfields.

FIG. 3B illustrates a portion 326 of a projection electron-beam lithography system similar to the projection electron-beam lithography system 200 shown in FIG. 2B. The difference between the portion 326 shown in FIG. 3B and the portion 300 shown in FIG. 3A is that the portion 326 shown in FIG. 3B shows the electronic optical axis 130 being deflected to coincide with the centerlines of the electron beams emerging from the subfields in the reticle 102. Three subfields 302, 304 and 306 of the reticle 102 are shown with electron beams 308, 310 and 312 emerging from the subfields 302, 304 and 306 respectively. Each of the electron beams 308, 310 and 312 have a centerline 314, 316 and 318, respectively. As discussed above, for minimum distortion of the electronic beams caused by aberrations it is necessary that each of the centerlines 314, 316, and 318 coincide with the electronic optical axis 130 of the projection lens system 104. For illustrative purposes, the electronic optical axis 130 is shown misaligned with the centerline 314 of the electron beam 308. The amount of the misalignment is shown at 328. Similarly, the electronic optical axis 130 is shown misaligned with the centerlines 316 and 318 of electron beams 310 and 312, respectively. The misalignment of the electronic optical axis 130 with the centerline 316 is shown at 330 and the misalignment of the electronic optical axis 130 with the centerline 318 is shown at 332. As can be appreciated, the electronic optical axis 130 may be misaligned with the electron beams emerging from each of the subfields in the reticle and that misalignment must be corrected to minimize the aberrations and distortion of the electron beams.

Figure 4:
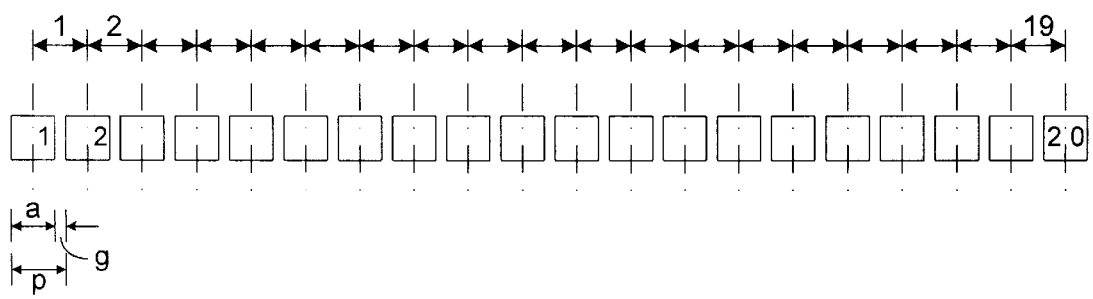
FIG. 4 illustrates a single row of subfields on a reticle and shows typical dimensions of the subfields.

FIG. 4 shows a row of 20 subfields that could be found in a typical reticle. It should be appreciated that the number of subfields in a row can be a number other than 20. For purposes of illustration and discussion, there are shown 20 subfields having a width "a," a grillage "g" and a pitch "p" that is equal to (a+g). In order to have a specified accuracy for a given number of subfields as shown in FIG. 4, the number of bits required to control the DAC that control the deflection systems can be calculated from the following:

$Bits_{required} = \log_2$ [total length of the row of subfields/accuracy] and where the total length of the row of subfields= (m−1) times the pitch p, the number of bits is calculated as follows:

$$Bits_{required} = \log_2[(m-1)p/accuracy].$$

where m equals the number of sub fields and p is the pitch. It is noted that the calculation is rounded up to the next highest bit. As shown in FIG. 4, because the steps are measured from the centers of the subfields, the number used in the calculation is m−1. If the number of subfields is assumed to be 20, if the width "a" of the subfields is assumed to be 1 millimeter and the grillage is assumed to be 0.3 millimeters, the number of bits required for a 1 nanometer accuracy at the wafer (a 4 nanometer accuracy at the reticle—assuming that the magnification is ¼×) is calculated as follows for the reticle deflection system:

$Bits_{required} = \log_2[19(1.3 \text{ mm})/4 \text{ nm}] = 22.56$ bits or 23 bits rounded upward.

In the method of projection electron-beam lithography, it has been found to be advantageous to electronically scan the field of view in one direction. This greatly reduces the required stage speed for a given throughput. This can also be thought of as a way to increase the field size of the lens system while maintaining low aberrations and field curvature. This technique, however, requires very accurate deflection at both the reticle and wafer planes in order to preserve image quality and overlay accuracy. Previous approaches involve the use of 4 high speed, high precision DACs, two at the reticle plane and two at the wafer plane. An examination of the parameters of the typical electron-beam lithographic system indicates that achieving the required DAC resolution and speed is very challenging. For example, a system with a 0.25 by 0.25 millimeter field size at the wafer, ¼× magnification, 100 μA beam current at the reticle, a 25 μm beam current at the wafer (25% reticle transmission) and 5 μC/cm² resist sensitivity, requires an exposure time of 32 μsec per subfield. This indicates the potential throughput drops in half if the DAC settling time is as long as 32 μsec. A typical requirement for the settling time may be less than 25 μsec. Considering resolution, a typical electron-beam lithography system might have a 5 millimeter wide deflection at the wafer in one direction, thus dividing the scan area into 20 subfields (5 mm/0.25 mm) that must be scanned accurately. For a 1 nanometer accuracy at the wafer and a 4 nanometer accuracy at the reticle, the reticle scan DACs must have at least approximately a 23 bit scan accuracy $\log_2$ (24.7 mm/4 nm)≈22+ bits, which is rounded to 23 bits. The wafer scan DAC requires $\log_2$ (4.75 mm/1 nm)=22.2 bits, which is rounded to 23 bits. However, 23 bit, 25 μsec DACs are not presently commercially available.

Figure 5A:
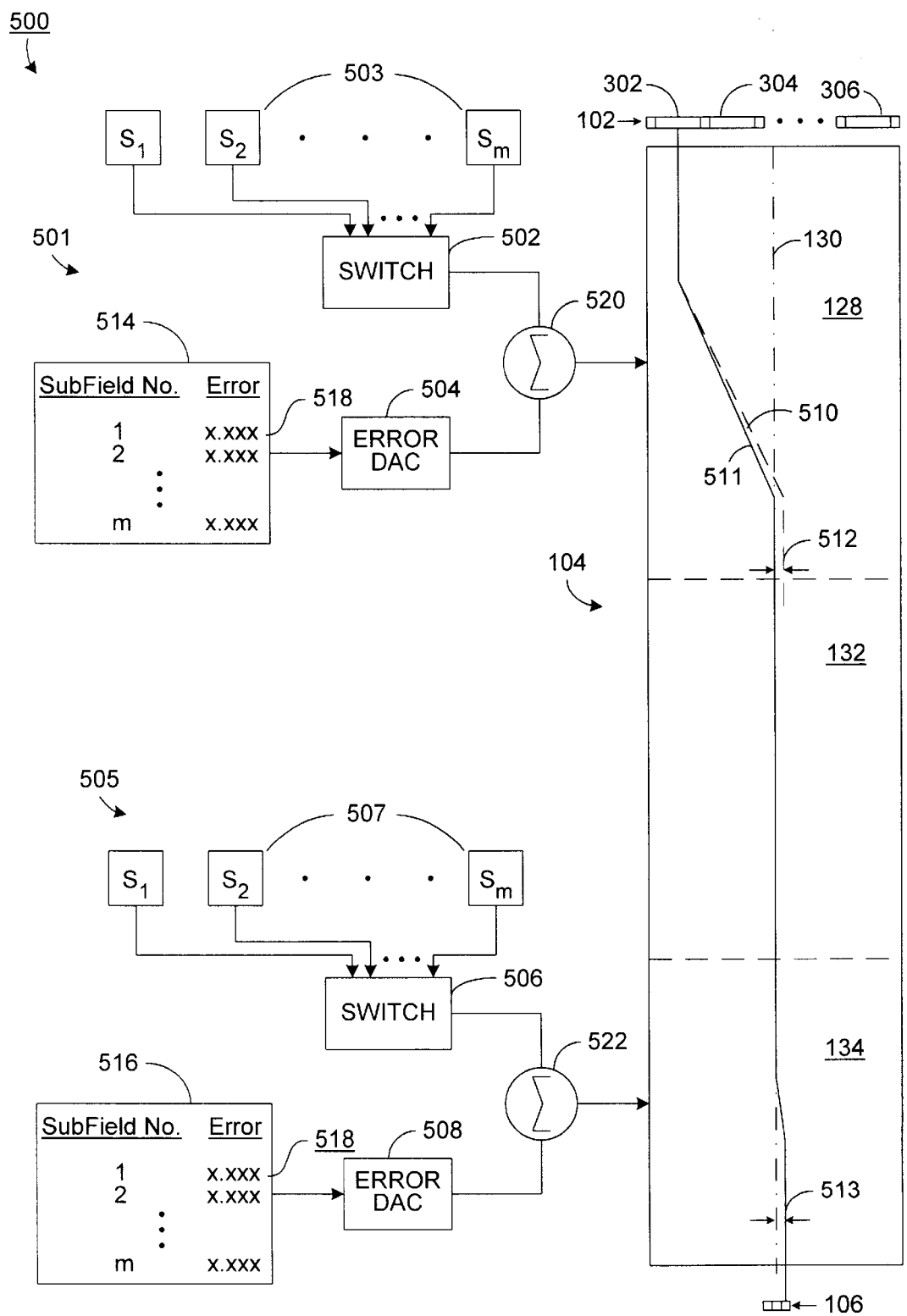
FIG. 5A illustrates a first embodiment of the present invention for accurately deflecting the electron beams emerging from each subfield on the reticle to coincide with the electronic optical axis of the electronic lens system.

Referring to FIG. 5A, there is illustrated a device 500 and a method to correct the misalignment of the electron beams emerging from the subfields on the reticle 102 with the electronic optical axis 130 of the electronic lens system 104 as shown in FIG. 3 and with the reticle 102 divided into rows having m=20 subfields per row as shown in FIG. 4. The device 500 includes the electronic lens system 104, a first control section 501 comprising a first switch 502 and a first error DAC 504 that control the operation of a deflection system in the first section 128 of the electronic lens system 104. The first switch 502 switches between first sources $S_1$ through $S_m$ 503. The first sources 503 may be current sources or voltage sources. The m first sources coincide with the m subfields, for example, the first switch 502 switches to first source $S_1$ when the first subfield in a row is being illuminated and switches to first source $S_2$ when the second subfield in a row is being illuminated and so on until all subfields in a row have been illuminated. The device 500 also includes a second control section 505 comprising a second switch 506 and a second error DAC 508 that control the operation of a deflection system in the third section 134 of the electronic lens system 104. The second switch 506 switches between second sources $S_1$ through $S_m$ 507. The second sources 507 may be current sources or voltage sources.

As discussed above, the centerline 510 of the electron beam emerging from the subfield 302 may be misaligned from the electronic optical axis 130 as indicated at 512 due in part to a positioning error in the relevant first source 503. The path 511 is the desired path for the centerline 510 of the electron beam. As also discussed above, each of the electron beams that emerge from each of the subfields in the reticle 102 may each have a unique misalignment or alignment error and it is necessary that the device 500 be capable of correcting each of the misalignment errors as the electron beam is moved from subfield to subfield. The required accuracy of the first sources $S_1$ 503 and the second sources $S_2$ 507 and the error DACs 504 & 508 will be discussed below. The first sources $S_1$ 503 cause the centerlines of the electron beams such as the centerline 510 of the electron beam to be deflected towards the electronic optical axis 130. The second sources $S_2$ cause the centerlines of the electron beams to be deflected to the appropriate region on the wafer 106. If there is a misalignment or alignment error as indicated at 512 the first error DAC 504 supplies a signal to correct the misalignment so that the centerline 510 of the electron beam coincides with the electronic optical axis 130. Similarly, if there is a misalignment or alignment error, as indicated at 513, of the centerline 510 of the electron beam with the appropriate region on the wafer 106, the second error DAC 508 supplies a signal to correct the misalignment or alignment error. As shown in FIG. 5A, the first and second error DACs 504 & 508 generate a correction signal from Tables 514 & 516, respectively, which have error data 518 tabulated for each subfield. The error data 518 is generated by running a calibration reticle through the lithography system and observing and tabulating the errors. As can be appreciated, a major requirement of the first sources 503 and the second sources 507 is that they are consistent in the amount of misalignment for each subfield. In other words, the misalignment for a given subfield in each row must be the same each time that subfield in each row is illuminated by the electron beam. The signal from each of the first sources $S_1$ through $S_m$ 503 and from each of the second sources $S_1$ through $S_m$ 507 is summed at 520 & 522 with the signal from the error DACs 504 & 508, respectively. The summed signals then control the deflection system in the first section 128 of the electronic lens system 104 and in the second section 134 of the electronic lens system 104. If there are 20 subfields in a row, there will be 20 first sources that are sequentially switched by switch 502 corresponding to the subfield being illuminated. For example, when the first subfield in a row is being illuminated, the output of first source $S_1$ is input to the summer 520. Similarly, if there are 20 subfields in a row, the switch 506 will have 20 second sources as inputs, indicated at 507 that are sequentially input to summer 522 corresponding to the subfield being illuminated.

Figure 5B:
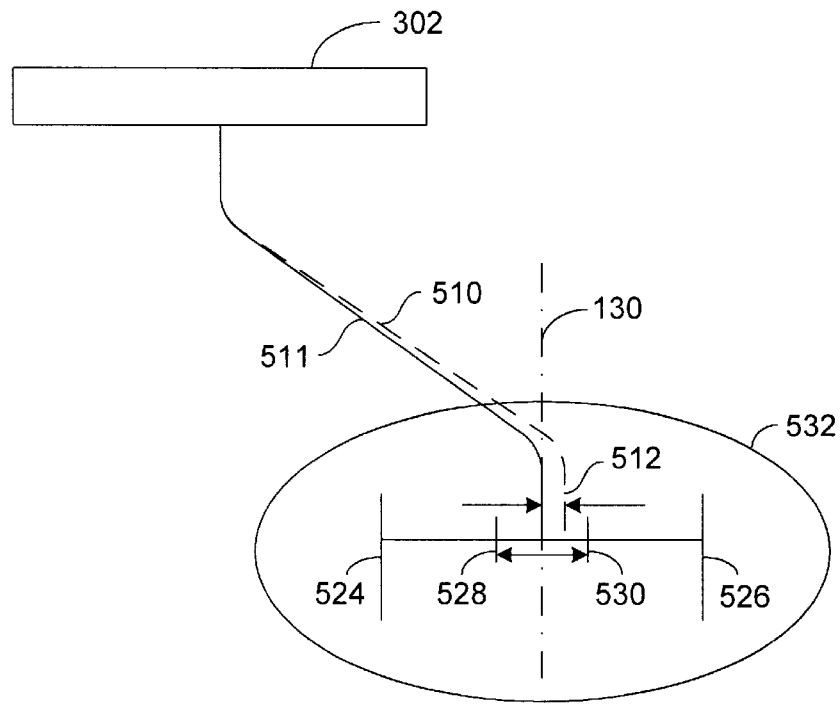
FIG. 5B shows in more detail an electron beam emerging from a subfield on the reticle being deflected to coincide with the electronic optical axis of the electronic lens system showing a position error caused by a misalignment of the centerline of the electron beam emerging from the subfield with the electronic optical axis of the electronic lens system.

FIG. 5B shows in more detail the centerline 510 of the electron beam emerging from subfield 302 and the desired path 511 to the electronic optical axis 130. The lines 524 & 526 denote the field of view within which it is desired that the centerline 510 of the electron beam be deflected by the pertinent first source 503 (FIG. 5A). The lines 528 & 530 denote the field of view within which it is desired that the centerline 510 of the electron beam be deflected by the pertinent first source 503 in order for the error DAC 504 to correct the misalignment with the desired accuracy. As discussed above, to achieve a desired positional accuracy of 1 nanometer at the wafer, the desired accuracy of a DAC to control the deflection of the electron beams from 20 subfields having a width of 1 millimeter and a grillage of 0.3 millimeters is calculated to be 23 bits. And as also discussed above, 23 bit DACs having the required speed are not presently commercially available. Therefore, it is desirable to provide the desired accuracy using DACs that are commercially available. For example, it would be desirable to achieve the desired accuracy using a 16 bit error DAC, which are commercially available at a reasonable cost and which have the required speed. The portion of the system within the ellipse 532 is shown enlarged in FIG. 5C.

Figure 5C:
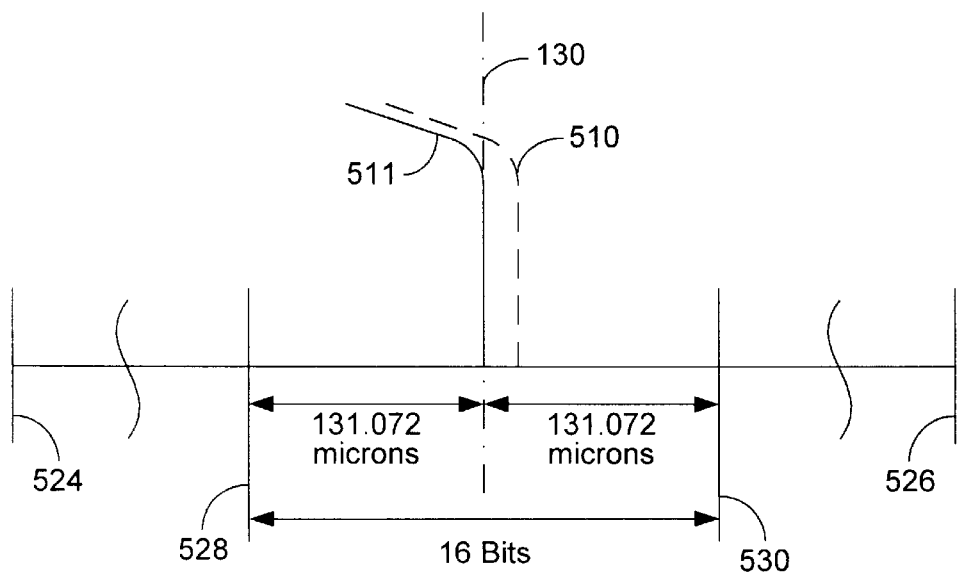
FIG. 5C illustrates the accuracy required for the deflection system deflecting a centerline of an electron beam emerging from a subfield in the reticle to coincide with the electronic optical axis.

Referring to FIG. 5C there is illustrated in more detail the field of view through which it is desired that the electron beams pass. The field of view is around the electronic optical axis 130 of the electronic lens system 104. The range within which the first sources 503 must deflect the electron beam is between lines 528 & 530 and is determined from the following condition:

$$M \cdot A \cdot 2^B = R_R,$$

where M is the magnification, A is the desired position accuracy of the electron-beam lithography system at the wafer, B is the accuracy of the first error DAC 504 and $R_R$ is the range within which the first sources 503 must deflect the electron beam from each subfield from the electronic optical axis 130 of the electron lens system 104. For example, if the desired position accuracy of the electron-beam lithography system is 1 nanometer at the wafer and the first error DAC 504 has 16 bit accuracy, the range $R_R$ is calculated as follows:

$$R_R = 4 \cdot 1 \text{ nanometer} \cdot 2^{16} = 262{,}144 \text{ nanometers} = 262.144 \ \mu\text{m}(\pm 131.072 \ \mu\text{m}).$$

Similarly, if the desired position accuracy of the electron-beam lithography system is 1 nanometer at the wafer and the second error DAC 508 has a 16 bit accuracy, the range $R_W$ within which the second sources 507 must deflect each electron beam to the appropriate region on the wafer 106 is calculated as follows:

$$R_W = 1 \text{ nanometer} \cdot 2^{16} = 65{,}536 \text{ nanometers} = 65.536 \ \mu\text{m}(\pm 32.768 \ \mu\text{m}).$$

It should be appreciated that the first error DAC 504 could have an accuracy from 8 bits to 18 bits with the required accuracy of the first sources 503 adjusted to compensate for the selected accuracy of the first error DAC 504. For example, if the first error DAC 504 is selected to have a 12 bit accuracy, the first sources 503 would have to deflect the electron beam closer to the electronic optical axis as follows:

$$R_R = 4 \cdot 1 \text{ nanometer} \cdot 2^{12} = 16{,}384 \text{ nanometers} = 16.384 \ \mu\text{m}(\pm 8.192 \ \mu\text{m}).$$

The required range $R_W$ would be calculated as follows:

$$R_W = 1 \text{ nanometer} \cdot 2^{12} = 4{,}096 \text{ nanometers} = 4.096 \ \mu\text{m}(\pm 2.048 \ \mu\text{m}).$$

As should be appreciated, the 12 bit error DAC requires that the first sources 503 and the second sources 507 be much more accurate in deflecting the centerlines of the electron beams.

Figure 5D:
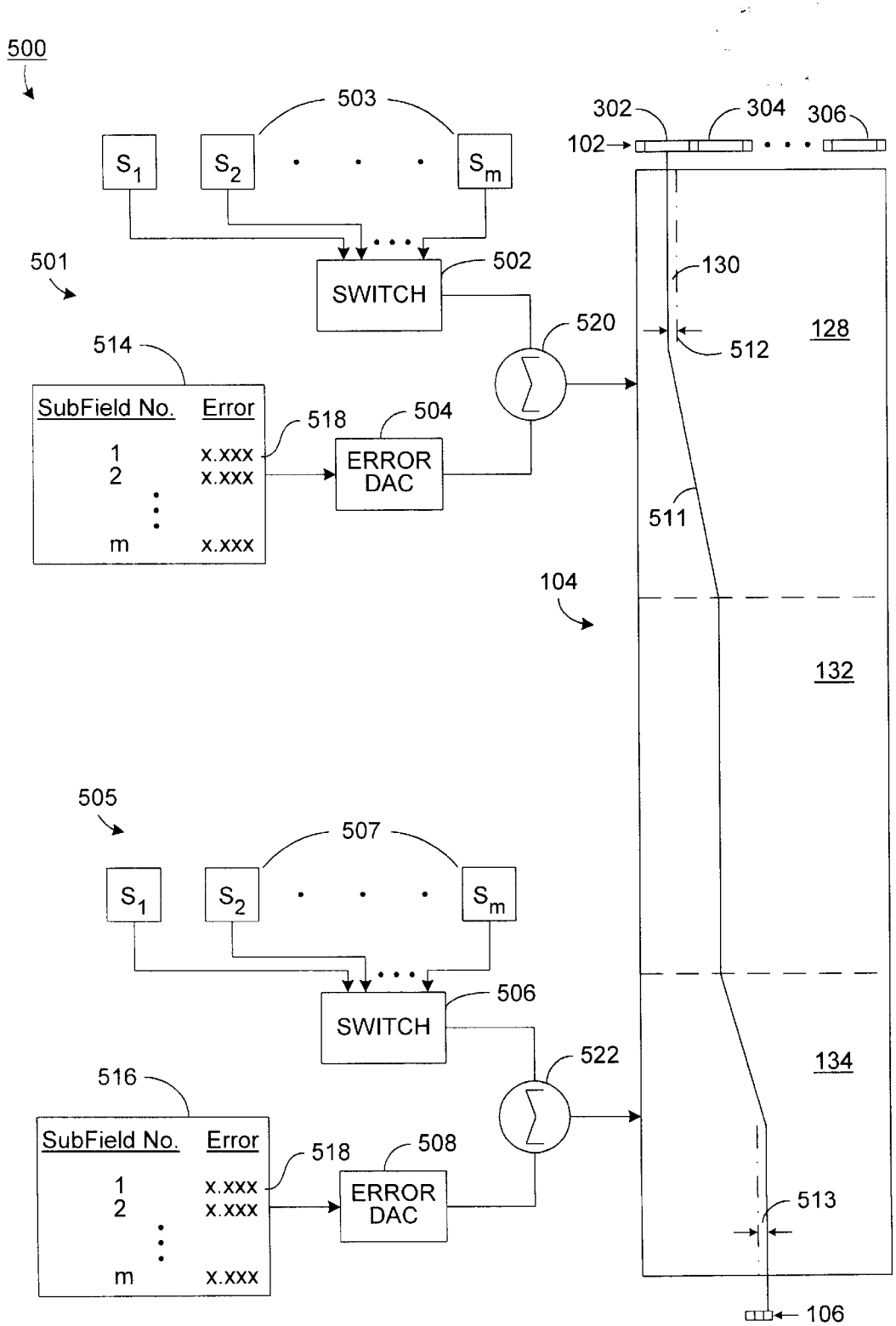
FIG. 5D illustrates a second embodiment of the present invention for accurately deflecting the electronic optical axis to coincide with the electron beams emerging from each of the subfields on the reticle.

Referring to FIG. 5D, there is illustrated the device 500 as described above in conjunction with FIG. 5A configured to correct the misalignment of the electronic optical axis 130 with the centerlines of the electron beams as the electronic optical axis 130 is moved to coincide with the centerlines of the electron beams emerging from each subfield. The functions of the elements of the device 500 shown and described in FIG. 5D are the same as those shown and described in FIG. 5A. The device 500 functions in FIG. 5D to deflect or move the optical axis 130 to coincide with the centerlines of the electron beams emerging from the subfields in the reticle 102. The parameters calculated and discussed in conjunction with FIG. 5A are the same with the exception that the first and second sources 503 and 508 deflect the electronic optical axis 130 and the error DACs 504 and 507 correct any misalignment of the electronic optical axis 130.

Figure 5E:
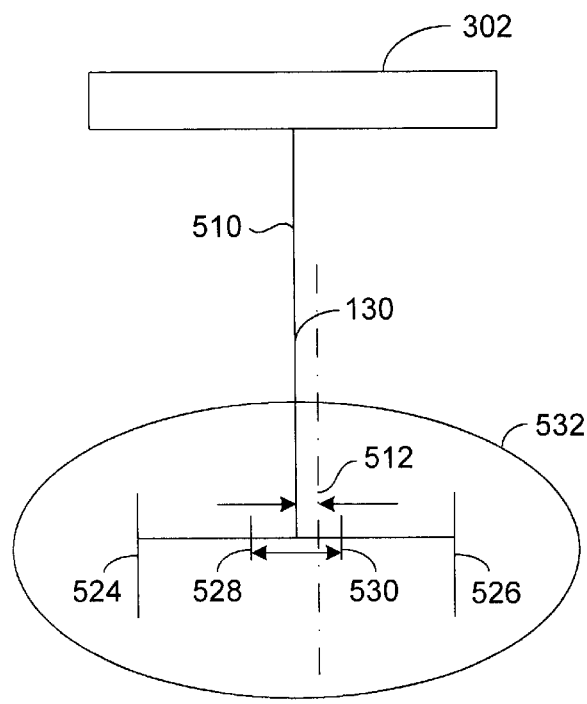
FIG. 5E shows in more detail an electron beam emerging from a subfield on the reticle and the electronic optical axis being deflected to coincide with the centerline of the electron beam showing a position error caused by a misalignment of the electronic optical axis with the centerline of the electron beam.
Figure 5F:
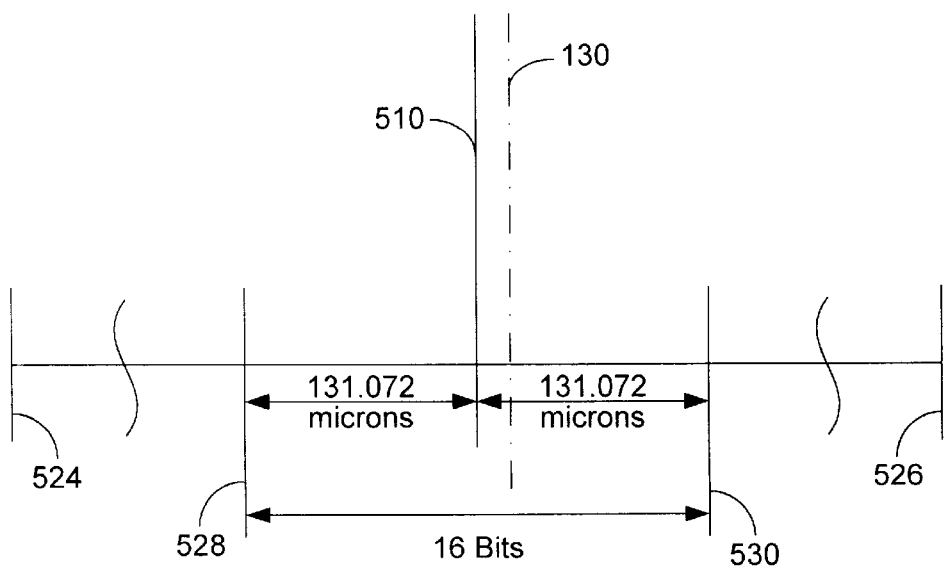
FIG. 5F illustrates the accuracy required for the deflection system deflecting the electronic optical axis to coincide with the centerline of an electron beam emerging from a subfield on the reticle.

Referring to FIGS. 5E & 5F, there is shown in more detail the electronic optical axis 130 and the centerline 510 of an electron beam emerging from the subfield 302. As discussed above, it is desired that the electronic optical axis 130 be moved so that it is coincident with the centerline 510. The lines 524 & 526 denote the boundaries of the electron beam emerging from the subfield 302. The lines 528 & 530 denote the field of view within which it is desired that the electronic optical axis 130 be deflected by the pertinent first source 503 in order for the error DAC 504 to correct the misalignment with the desired accuracy. As discussed above, in order to achieve a desired positional accuracy of 1 nanometer at the wafer, the desired accuracy of a DAC to control the deflection of the electronic optical axis 130 to be coincident with electron beams emerging from 20 subfields having a width of 1 millimeter and a grillage of 0.3 millimeters is calculated to be 23 bits. And as also discussed above, 23 bit DACs having the required speed are not commercially available. Therefore, it is desirable to provide the desired accuracy using DACs that are commercially available. The portion of the system within the ellipse 532 is shown enlarged in FIG. 5F.

Referring to FIG. 5F there is illustrated in more detail the field of view through which is desired that the electronic optical axis 130 be deflected. The range within which the first sources 503 (FIG. 5D) must deflect the electronic optical axis is determined from the following condition:

$$M \cdot A \cdot 2^B = R_R,$$

where M is the magnification, A is the desired accuracy of the electron-beam lithography system at the wafer, B is the accuracy of the error DAC 504 (FIG. 5D) and $R_R$ is the range within the first sources 503 must deflect the electronic optical axis 130 so that the electronic optical axis is coincident with the electron beams emerging from the subfields on the reticle 102. For example, if the desired position accuracy of the electron-beam lithography system is 1 nanometer at the wafer and the error DAC 504 has 16 bit accuracy, the range $R_R$ is calculated from the following relationship:

$$R_R = M \cdot A \cdot 2^B:$$

where M is the magnification, A is the desired position accuracy of the electron-beam lithography system at the wafer, B is the accuracy of the error DAC 504. Therefore:

$$R_R = 4 \cdot 1 \text{ nanometer} \cdot 2^{16} = 262,144 \text{ nanometers} = 262.144 \ \mu m (\pm 131.072 \ \mu m).$$

Similarly, if the error DAC 508 (FIG. 5D) has a 16 bit accuracy, the range $R_W$ within which the second sources 507 (FIG. 5D) must deflect the electronic optical axis 130 is calculated as follows:

$$R_W = 1 \text{ nanometer} \cdot 2^{16} = 65,536 \text{ nanometers} = 65.536 \ \mu m (\pm 32.768 \ \mu m).$$

Figure 6A:
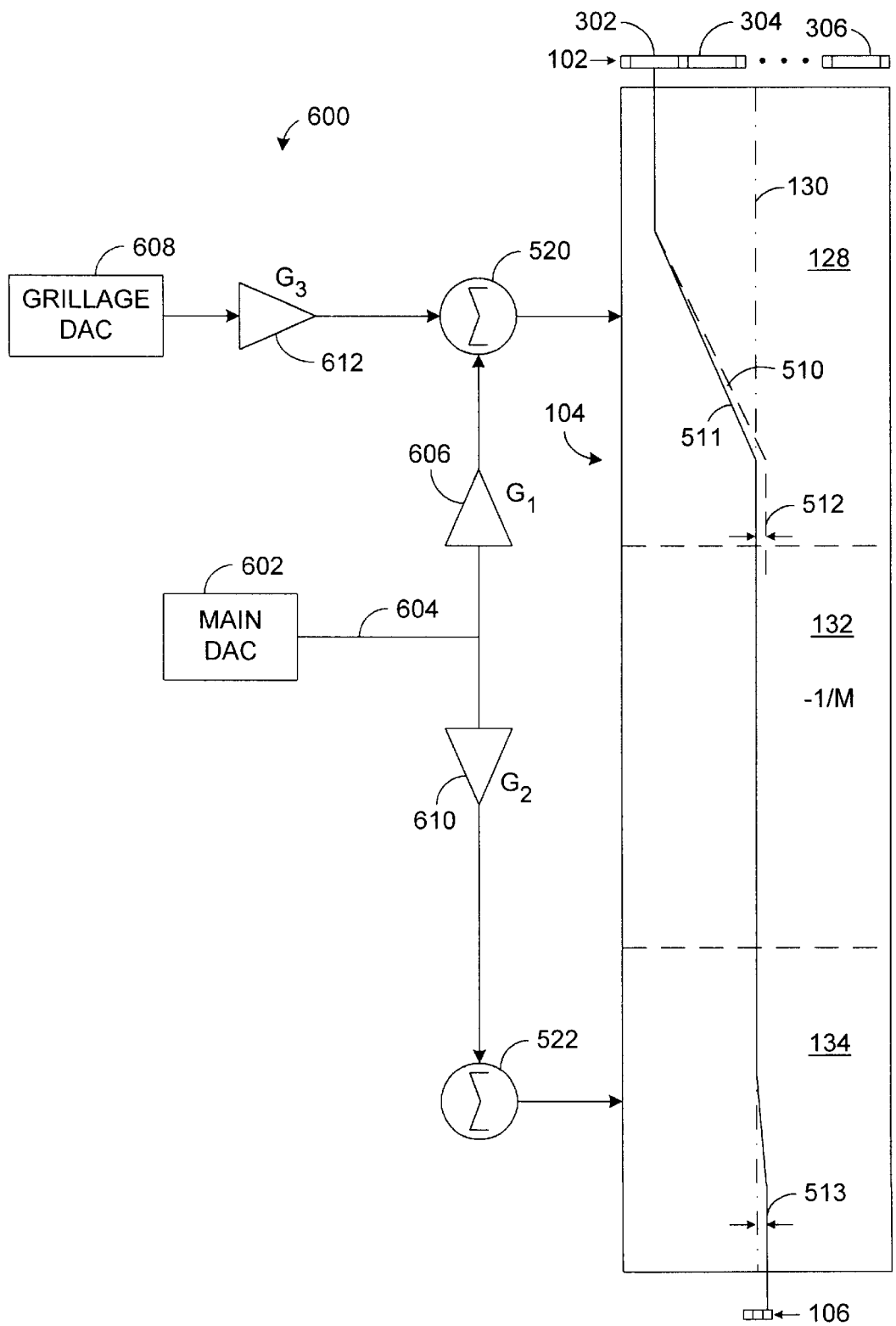
FIG. 6A illustrates a device for accurately deflecting the electron beams emerging from each subfield on the reticle so that the centerlines of the electron beams coincide with the electronic optical axis.

Referring to FIG. 6A there is shown a device 600 and method to correct the effects of the misalignment of the centerlines of the electron beams emerging from subfields in the reticle 102 with the electronic optical axis 130 of the electronic lens system 104 as shown in FIG. 4. The device 600 includes the electronic lens system 104, a main DAC 602 having an output 604 that is amplified by an amplifier 606 having a gain $G_1$ and input via summer 520 to the deflection system in section 128 of the electronic lens system 104. It should be understood that the deflection system in section 128 could be a magnetic deflection system or an electrostatic deflection system. The main DAC 602 has m discrete outputs corresponding to the number m of subfields in a row. As described above, the subfields in the reticle 102 may be separated by grillage. To account for the grillage when the electron beam is moved from subfield to subfield in a row, the output of a grillage DAC 608 after being reduced by a factor equal to the grillage $G_3$, in this case 0.3 (0.3 mm/mm), by amplifier 612 is summed by summer 520 with the output of amplifier 606 and input to the deflection system in section 128. The output 604 from main DAC 602 is amplified by amplifier 610 having a gain $G_2$ and input via summer 522 to the deflection system in section 134 of the electronic lens system 104. It is noted that there is only shown one input to summer 522. The summer may have other inputs to affect the deflection system in section 134. These other inputs are not an issue in the present invention and therefore are not shown or discussed. The magnification section 132 of the electronic lens system 104 has a magnification of (−1/M) where the negative indicates that the image is inverted from left to right and from top to bottom. If the following relationship is true:

$$G_1/G_2 = M,$$

the position of the image on the wafer is insensitive to many errors in the deflection system. The above relationship will be discussed below in conjunction with the discussion relating to FIGS. 8 & 9. In order to achieve 1 nanometer accuracy at the wafer, the grillage DAC must have an accuracy determined as follows:

$$\text{Bits}_{required} = \log_2[(m-1)g/\text{accuracy}],$$

where m equals the number of subfields and g is the grillage. In the case where m=20 and the grillage 0.3 millimeters, the required bits are calculated as follows:

$$\text{Bits}_{required} = \log_2[19(0.3 \text{ mm})/4 \text{ nm}] = 20.44 \text{ bits or } 21 \text{ bits}$$

rounded upward. Therefore, for the device 600 to accurately correct the misalignment of the electron beams, the grillage DAC 608 must have an accuracy of 21 bits. As discussed above, 21 bit DACs having the required speed are not commercially available at present.

Figure 6B:
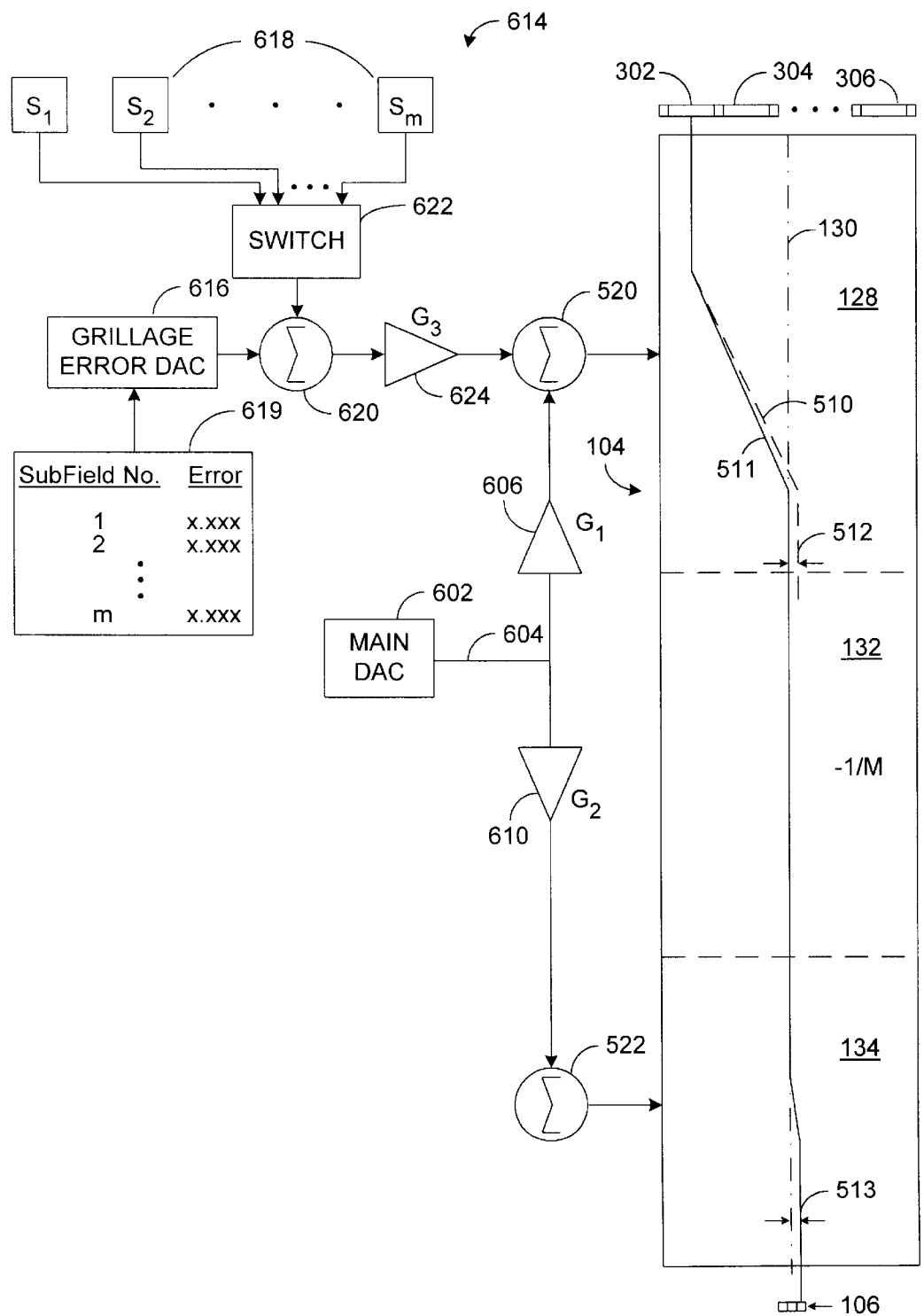
FIG. 6B illustrates a third embodiment of the present invention for accurately deflecting the electron beams emerging from each subfield on the reticle so that the centerlines of the electron beams coincide with the electronic optical axis.

Referring to FIG. 6B, there is illustrated a device 614 and method to obtain the required accuracy of 1 nanometer at the wafer with a DAC having on the order of 16 bit accuracy rather than the 21 bit accuracy calculated above. The device 614 includes the electronic lens system 104, a control section comprising the main DAC 602 having an output 604 that is amplified by amplifier 606 having a gain $G_1$ and input to summer 520. The output 604 is amplified by amplifier 610 having a gain $G_2$ and is input to summer 522. The output of summer 522 is input to the third section 134 of the electronic lens system 104. The main DAC 602 has m discrete outputs 604 corresponding to the number m of subfields in a row on the reticle 102. As described above, the position errors of the m outputs of the main DAC 602 are completely compensated for if the following condition is true:

$$G_1/G_2 = M.$$

However, because of the grillage between the columns, it is necessary to account for the grillage when moving from one subfield to the next in a row. Because the device 614 is insensitive to position errors caused by the main DAC 602 as described above, it is necessary for the grillage DAC to have the necessary accuracy in order to not degrade the position accuracy. The desired accuracy can be obtained with a 16 bit DAC rather than a 21 bit DAC by using a 16 bit DAC as a grillage error DAC 616 having m error inputs from an error table 619, a switch 622 having m source inputs, $S_1$ to $S_m$, 618 having high stability corresponding to the m subfields in a row on the reticle 102. The grillage error DAC 616 has an output to a summer 620 that also has input from switch 622. The error table 619 is constructed by running a calibration wafer through the system and tabulating the required corrections that are input to the grillage error DAC 616. The output of summer 620 is amplified by amplifier 624 and input to summer 520. The output of summer 520 is input to the deflection system in the first section 128 to control the deflection of the electron beams emerging from the subfields on the reticle 102.

Figure 6C:
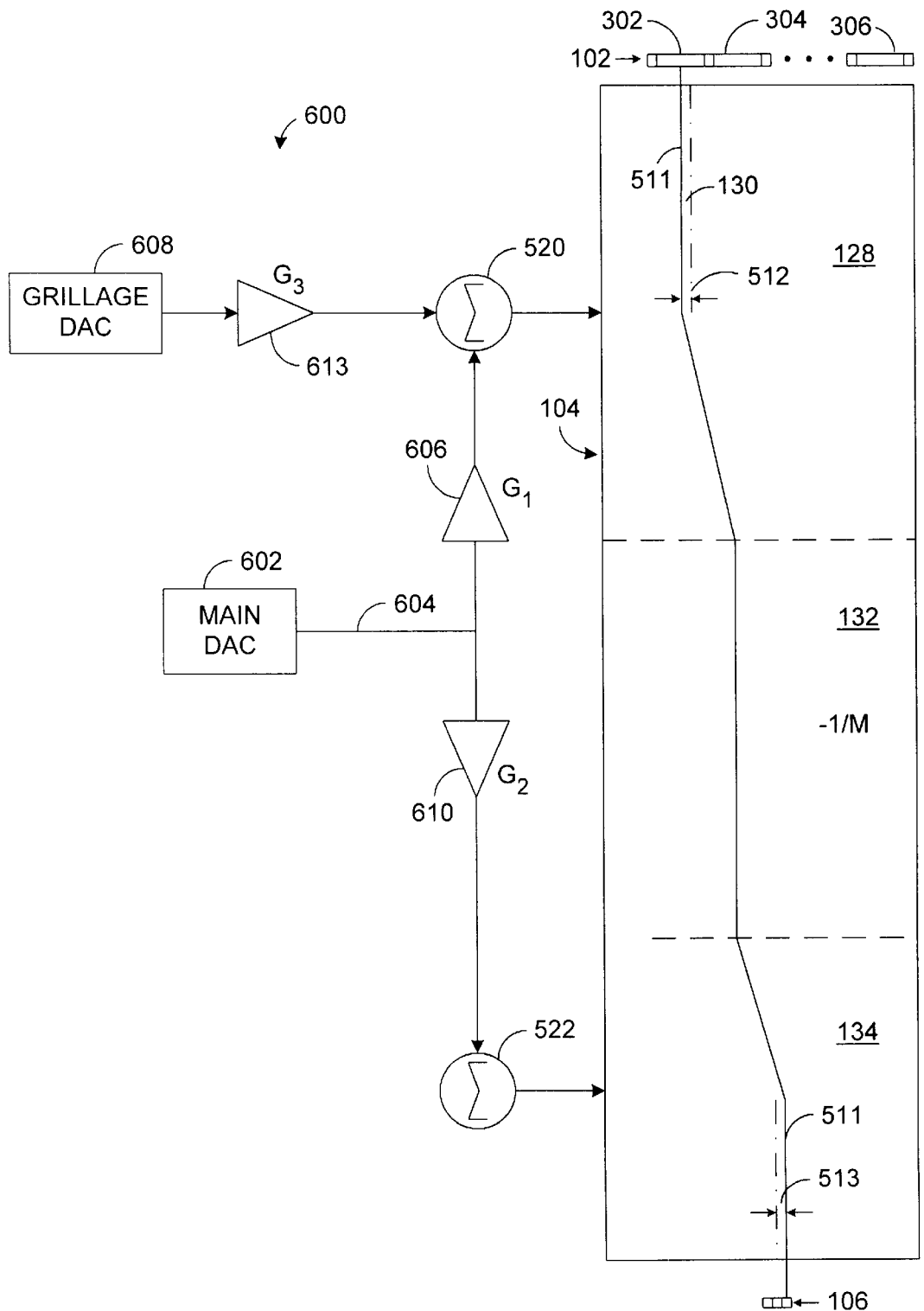
FIG. 6C illustrates a device for accurately deflecting the electronic optical axis to coincide with the centerlines of the electron beams emerging from each subfield on the reticle.

Referring to FIG. 6C, there is shown the device 600 and method shown in FIG. 6A configured to correct the misalignment of the electronic optical axis 130 with the centerlines of the electron beams emerging from the subfields in the reticle 102 as the electronic optical axis 130 is moved to coincide with the centerlines, such as the centerline 510. As discussed above, in order to obtain the necessary accuracy, the grillage DAC 608 must have an accuracy of 21 bits. And as discussed above, 21 bit DACs having the required speed are not commercially available.

Figure 6D:
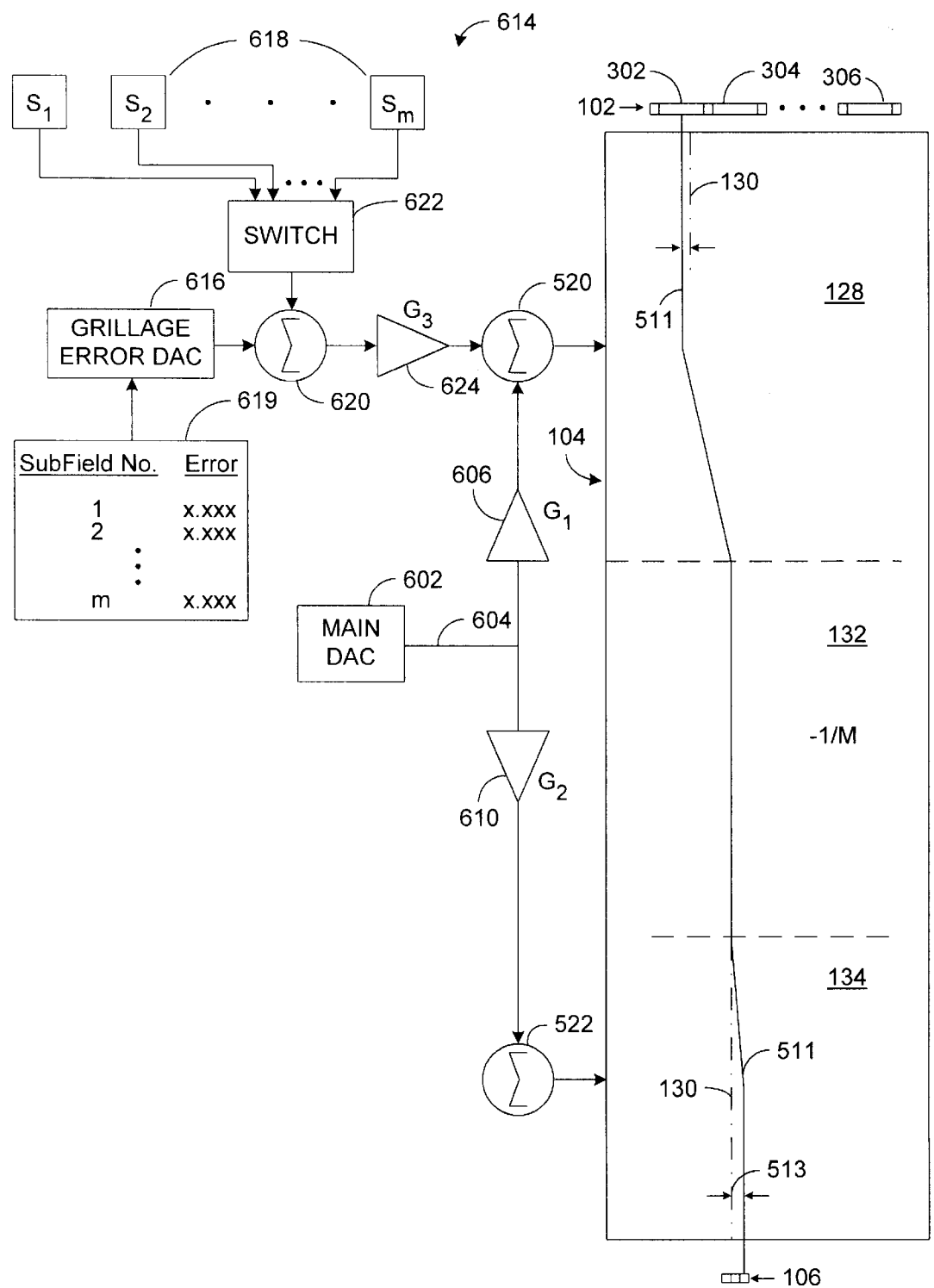
FIG. 6D illustrates a fourth embodiment of the present invention for accurately deflecting the electronic optical axis to coincide with the centerlines of the electron beams emerging from each subfield on the reticle.

Referring to FIG. 6D, there is illustrated the device 614 as shown in FIG. 6B configured to correct the misalignment of the electronic optical axis 130 with the centerlines of the electron beams emerging from the subfields in the reticle 102 as the electronic optical axis 130 is moved to coincide with the centerlines, such as the centerline 510 emerging from subfield 302. The inputs to summers 520 & 522 are the same as described above in the discussion of FIG. 6B and the outputs of summers 520 & 522 control the deflection systems in the first and third sections of the lens system 104, respectively. The deflection system in the first section 128 of the lens system 104 moves the electronic optical axis 130 to coincide with the electron beams emerging from the subfields in the reticle 102 and the deflection system in the third section 134 moves the electronic optical axis 130 to coincide with the centerlines of the electron beams.

Figure 7A:
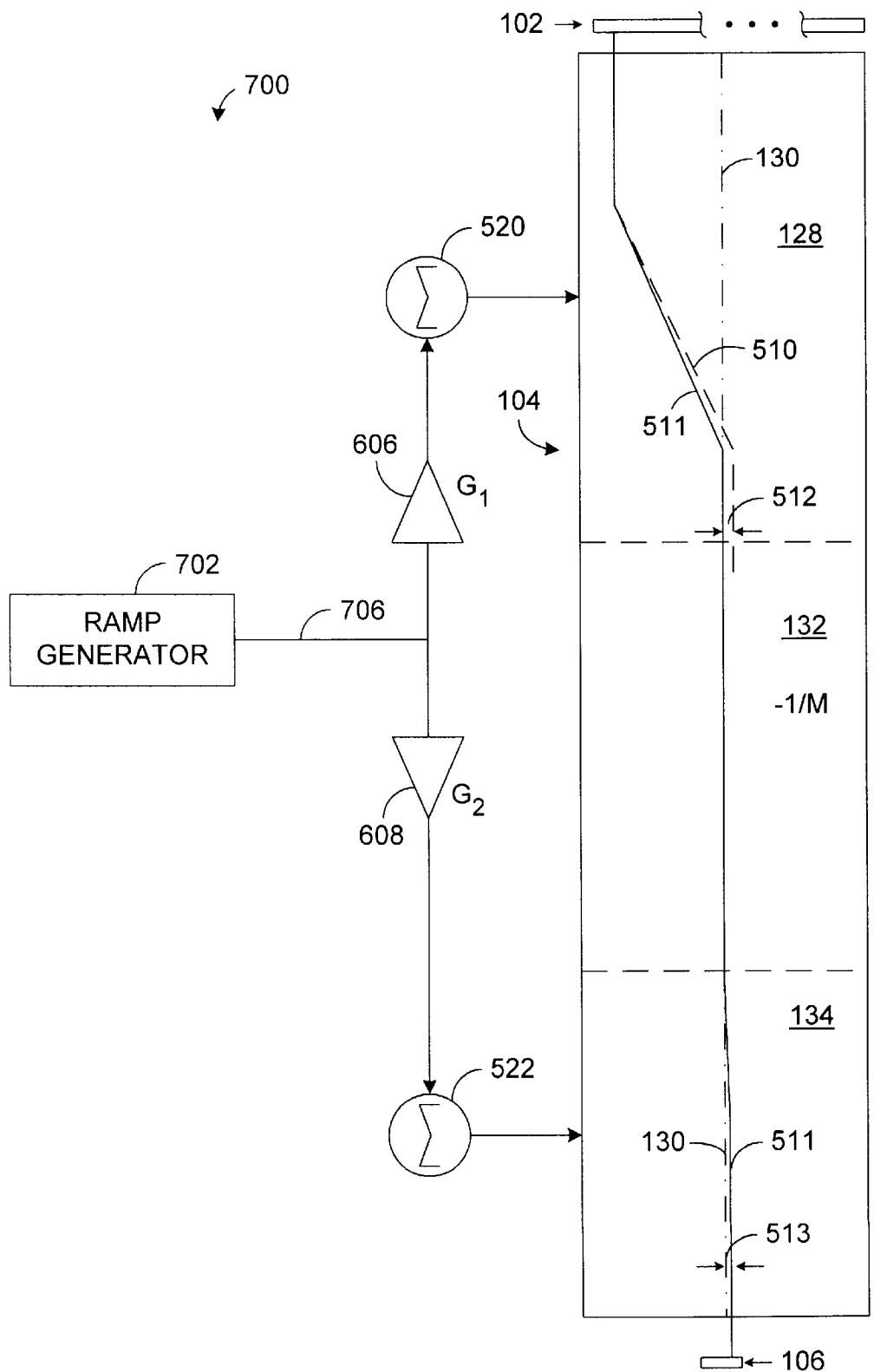
FIG. 7A illustrates a third embodiment of the present invention for accurately deflecting the electron beam emerging from each subfield on the reticle so that the centerlines of the electron beam coincide with the electronic optical axis.

Referring to FIG. 7A, there is shown a device 700 and method to correct the effects of the misalignment of the electron beam emerging from the reticle with the electronic optical axis 130 of the electronic lens system 104 as shown in FIG. 4. The device 700 includes a ramp generator 702 having an output 706 that is amplified by the amplifier 606 having a gain $G_1$ and input via summer 520 to the deflection system in section 128 of the electronic lens system 104. The areas on the reticle in this case are not separated by grillage in the direction of electronic scanning and the ramp generator 702 moves the electron beam from area to area on the reticle rather than the electron beam being stepped from subfield to subfield. As described above, the magnification section 132 of the electronic lens system 104 has a magnification of (−1/M) where the negative indicates that the image is inverted from left to right and from top to bottom. If the following relationship is true:

$G_1/G_2 = M$, the position of the image on the wafer is insensitive to many errors in the deflection system. The relationship will be discussed below in conjunction with the discussion relating to FIGS. 8 & 9.

Figure 7B:
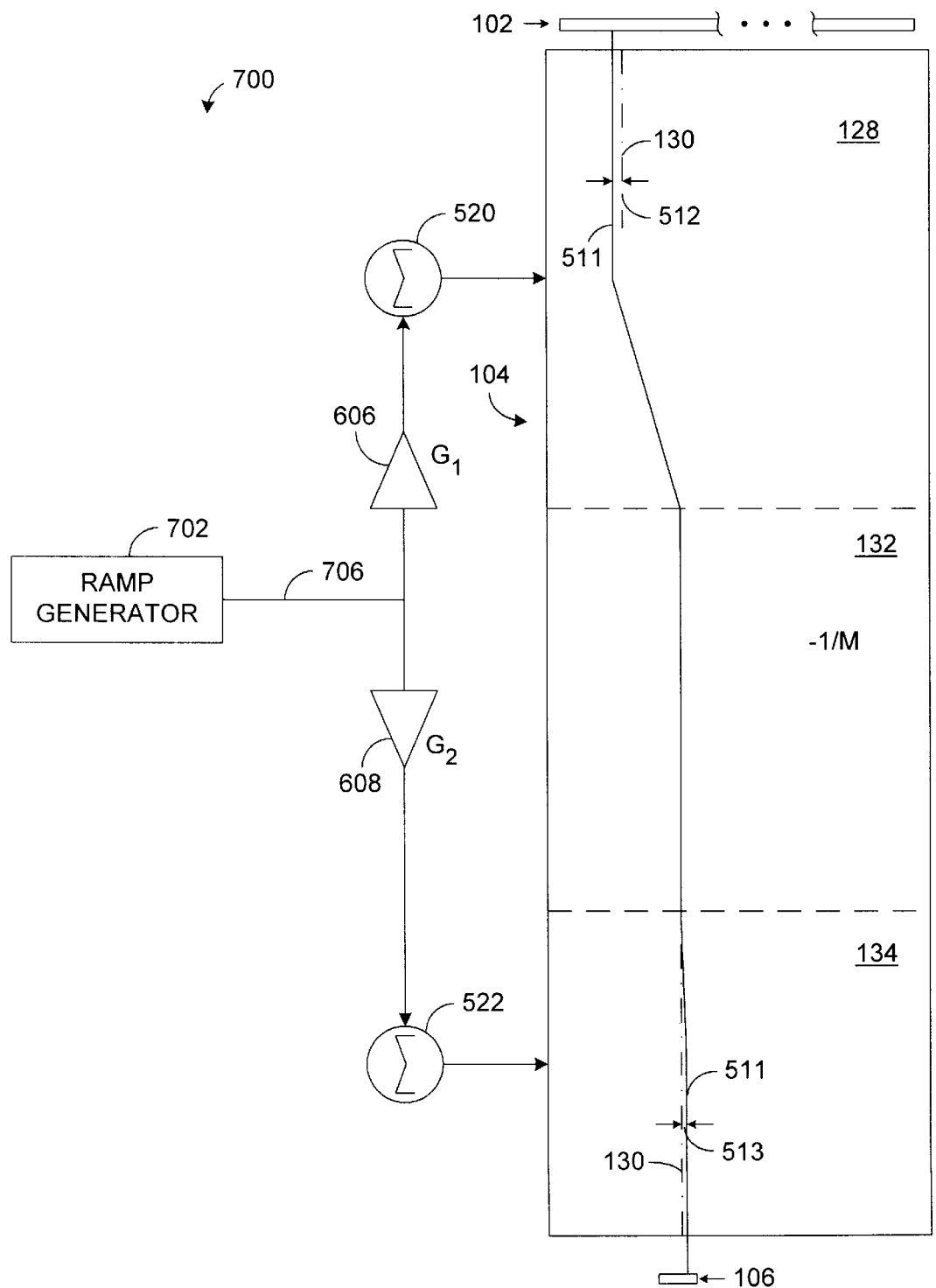
FIG. 7B illustrates a fifth embodiment of the present invention for accurately deflecting the electronic optical axis to coincide with the centerlines of the electron beams emerging from each subfield on the reticle.

Referring to FIG. 7B, there is illustrated the device 700 as shown in FIG. 7A configured to correct the misalignment of the electronic optical axis 130 with the centerlines of the electron beam emerging from the reticle 102 as the electronic optical axis 130 is moved to coincide with the centerlines, such as the centerline 511 emerging from the reticle 102. The inputs to summers 520 & 522 are the same as described above in the discussion of FIG. 7A and the outputs of summers 520 & 522 control the deflections systems in the first and third sections of the lens system 104, respectively. The deflection system in the first section 128 of the lens system 104 moves the electronic optical axis 130 to coincide with the electron beam emerging from the reticle 102 and the deflection system in the third section 134 moves the electronic optical axis 130 to coincide with the centerlines of the electron beam.

Figure 8:
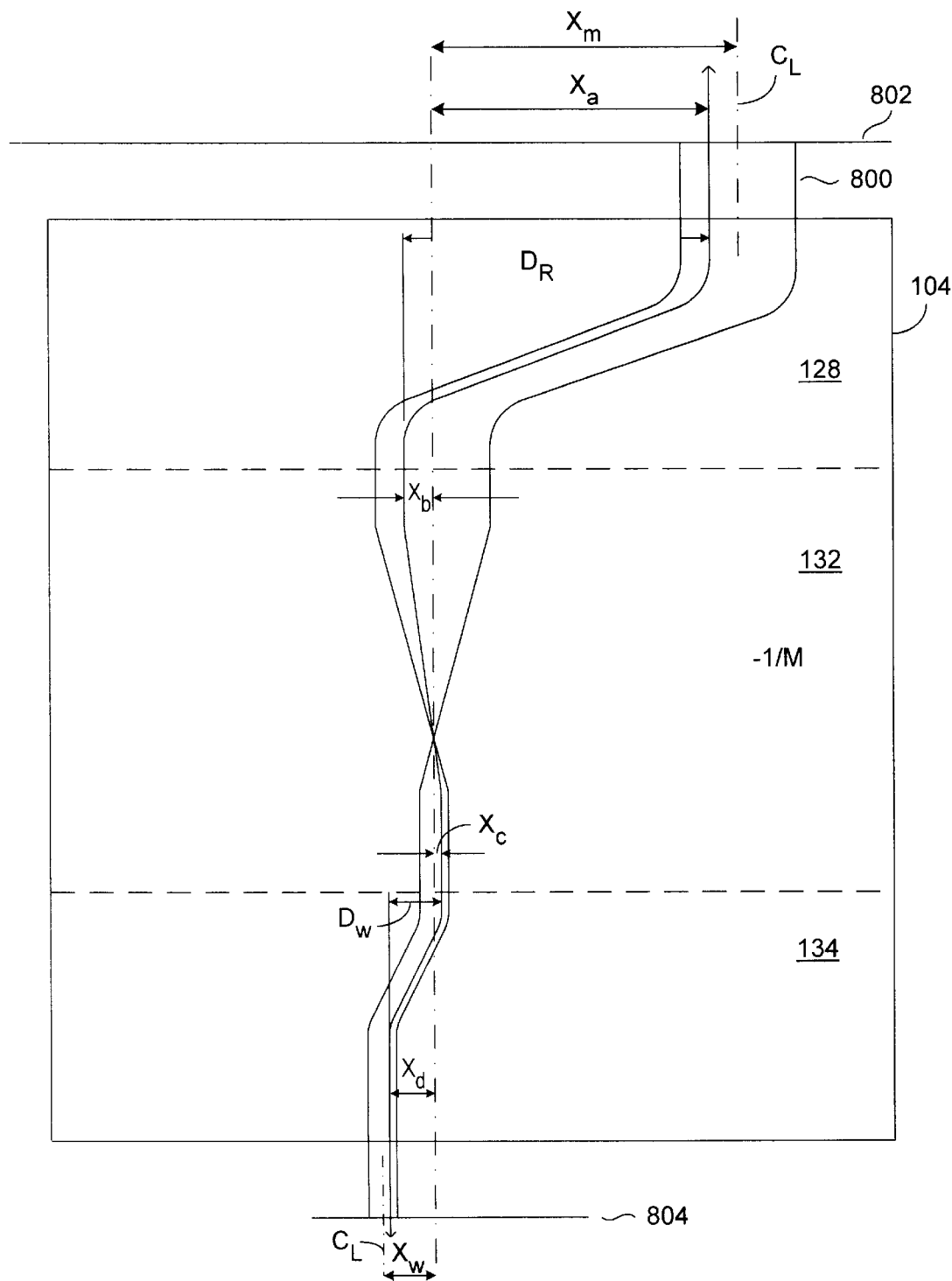
FIG. 8 illustrates the path of an electron beam that is deflected perfectly by the deflection system through the electronic lens system.

Referring to FIG. 8, there is shown an electron beam 800 being deflected from the reticle 802 to the wafer 804 through the electronic lens system 104. The electron beam 800 is shown being deflected without deflection error through the electronic lens system 104. The relationships of the indicated parameters are as follows:

$$x_b = x_a + D_R \tag{1}$$

$$x_c = -x_b/M \tag{2}$$

$$x_d = -x_b/M + D_W \tag{3}$$

substituting $$x_d = -(x_a + D_R)/M + D_W \tag{4}$$

$$x_d = x_a/M - D_R/M + D_W \tag{5}$$

if $D_R = MD_W$ \hfill (6)

then $$x_d = -x_a/M + M(-1/M)(D_W) + D_W \tag{7}$$

$$x_d = -x_a/M \tag{8}$$

Figure 9:
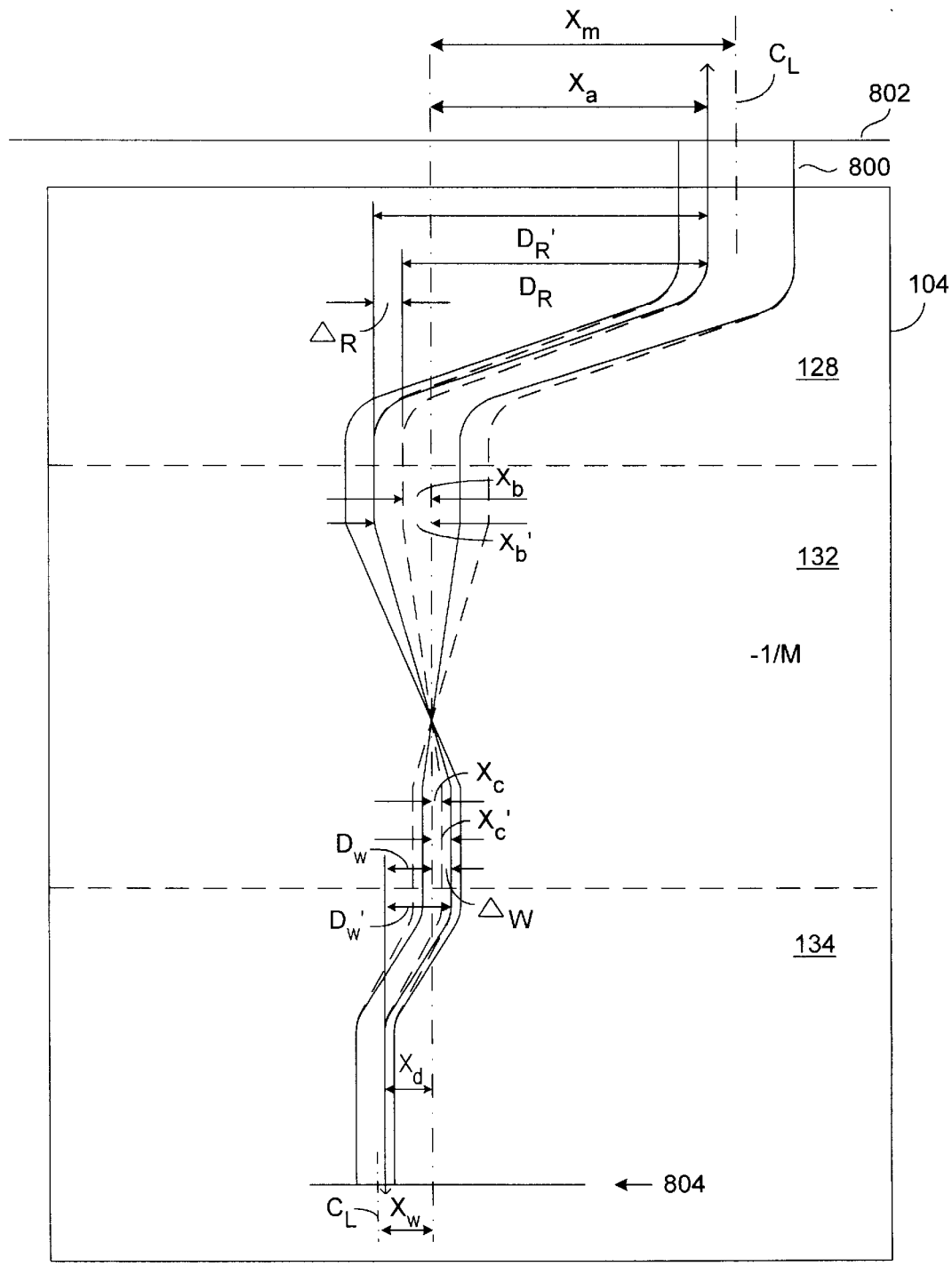
FIG. 9 illustrates how the path of an electron beam is made insensitive to imperfections in the deflection system by a method of the present invention.

Referring to FIG. 9 there is shown the electron beam 800 as shown in FIG. 8 being deflected from the reticle 802 to the wafer 804. The electron beam 800 is shown being deflected with a deflection error $\Delta_R$. The electron beam 800 deflected without a deflection error is reproduced in dashed outline and the parameters are shown unprimed. The parameters of the electron beam 800 that is deflected with deflection error $\Delta_R$ are shown primed. The relationships of the indicated parameters are as follows:

$$x_b' = x_a + D_R' \tag{9}$$

$$x_c' = -x_b'/M \tag{10}$$

$$x_d' = -x_b'/M + D_W' \tag{11}$$

$$X_d' = -(X_a + D_R')/M + D_{W'} \tag{12}$$

since $D_R' = D_R + \Delta_R$ \hfill (13)

$$x_d' = -(x_a + D_R + \Delta_R)/M \tag{14}$$

$$x_d' = -x_a/M + -D_R/M - \Delta_R/M + D_{W'} \tag{15}$$

since $D_W' = D_W + \Delta_{W'}$ \hfill (16)

$$x_d' = -x_a/M - D_R/M - \Delta_R/M + D_W + \Delta_W \tag{17}$$

if $D_R = MD_W$ and $\Delta_R = M\Delta_W$ \hfill (18)

$$x_d' = -x_a/M + M(-1/M)D_W + M(-1/M)\Delta_W + D_W + \Delta_W \tag{19}$$

$$x_d' = -x_a/M - D_W - \Delta_W + D_W + \Delta_W \quad (20)$$

$$\text{therefore } x_d' = -x_a/M \quad (21)$$

and comparing equation (8), which is $x_d = x_a/M$, it can be seen that:

$$x_d = x_d',$$

thus showing that if $D_R = MD_W$ the image position on the wafer is insensitive to the deflection error $\Delta_R$. Referring again to FIGS. 6 & 7, these results are obtained if the relationship:

$$G_1/G_2 = M, \text{ is true.} \quad (22)$$

For example, if $M=4$, $G_1=4$ and $G_2=1$, the relationship is true. Similarly, if $M=4$, $G_1=8$ and $G_2=2$ the relationship is true. It should be appreciated that any combination of M, $G_1$, and $G_2$ such that the above relationship (22) is true achieves the desired result.

In summary, the results and advantages of the electron-beam lithography systems of the present invention can now be more fully realized. The desired accuracy at the wafer can be obtained by utilizing commercially available 16 bit DACs. In other embodiments of the present invention, the electronic lens system in the electronbeam lithography system is made insensitive to position errors in the deflection control systems.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An electron-beam lithography system for transferring an image from a reticle to a wafer, comprising:

a reticle divided into subfields disposed in n rows and m columns;

a wafer;

an electronic lens system disposed between the reticle and the wafer for directing an electron beam from each subfield to an appropriate position on the wafer;

wherein the electronic lens system comprises a first section for deflecting the electron beam from each subfield to an electronic optical axis of the electronic lens system, a second section for demagnifying the electron beam and a third section for deflecting the electron beam emerging from the second section to the appropriate position on the wafer;

a first switch for switching between m first sources that provide inputs to a deflection system in the first section of the electronic lens system;

a first error DAC for correcting a position error in the input from the first switch;

wherein the input from the first switch deflects a centerline of the electron beam from each subfield to within a range from the electronic optical axis of the electronic lens system in accordance with the following condition:

$$M \cdot A \cdot 2^B = R_R,$$

wherein $R_R$ is the range within which the input from the first switch is designed to deflect the electron beam from each subfield in the reticle to the electronic optical axis, A is the desired accuracy of the electron-beam lithography system at the wafer, B is the accuracy of the first error DAC and M is the magnification of the second section for demagnifying the electron beam.

2. The electron-beam lithography system of claim 1 further comprising:

a first error table with m outputs to the first error DAC; and wherein the value of each input to the first switch from each of the m first sources is determined from a calibration procedure in which the difference between a desired position and an actual position of the electron beam in relation to the electronic optical axis is tabulated in the first error table, wherein the tabulated values correct the electron beam from each subfield deflected by the input from the first switch to within the desired accuracy A from the electronic optical axis.

3. The electron-beam lithography system of claim 2 further comprising:

a second switch for switching between m second sources that provide inputs to a deflection system in the third section of the electronic lens system; and a second error DAC for correcting a position error in the input from the second switch, wherein the input from the second switch deflects the centerline of the electron beam emerging from the second section to within a range from the desired position on the wafer in accordance with the following condition:

$$A \cdot 2^B = R_W,$$

wherein $R_W$ is the range within which the second switch is designed to deflect the electron beam from the second section to the desired position on the wafer, A is the desired accuracy of the electron-beam lithography system at the wafer and B is the accuracy of the second error DAC.

4. The electron-beam lithography system of claim 3 further comprising:

a second error table with m outputs to the second error DAC; and wherein the value of each input to the second switch from each of the m sources is determined from a calibration procedure in which the difference between a desired value and an actual value is tabulated in the second error table, wherein the tabulated values correct the position of the electron beam emerging from the second section deflected by the inputs to the second switch to within the desired accuracy A from the desired position on the wafer.

5. The electron-beam lithography system of claim 4 wherein the desired accuracy of the electron-beam lithography system at the wafer is in the range of 0.5 to 100 nanometers.

6. The electron-beam lithography system of claim 5 wherein the accuracy of the first and second error DACs is in the range of 8 bits to 18 bits.

7. An electron-beam lithography system for transferring an image from a reticle to a wafer, comprising:
- a reticle divided into subfields disposed in n rows and m columns;
- a wafer;
- an electronic lens system disposed between the reticle and the wafer for directing an electron beam from each subfield to an appropriate position on the wafer;
- wherein the electronic lens system comprises a first section for deflecting an electronic optical axis of the electronic lens system to coincide with a centerline of the electron beam from each subfield, a second section for demagnifying the electron beam and a third section for deflecting the electronic optical axis of the electronic lens system to coincide with the centerline of the electron beam emerging from the second section of the electronic lens system;
- a first switch for switching between m first sources that provide inputs to a deflection system in the first section of the electronic lens system;
- a first error DAC for correcting a position error in the input from the first switch;
- wherein the input from the first switch deflects the electronic optical axis of the electronic lens system to within a range from the centerline of the electron beam from each subfield in accordance with the following condition:

$$M \cdot A \cdot 2^B = R^R,$$

wherein $R^R$ is the range within which the input from the first switch is designed to deflect the electronic optical axis from the centerline of each electron beam from each subfield of the reticle, A is the desired accuracy of the electron-beam lithography system at the wafer, B is the accuracy of the first error DAC and M is the magnification of the second section for demagnifying the electron beam.

8. The electron-beam lithography system of claim 7 further comprising:
- a first error table with m outputs to the first error DAC; and
- wherein the value of each input to the first switch from each of the m first sources is determined from a calibration procedure in which the difference between a desired position and an actual position of the electronic optical axis in relation to the centerline of each electron beam from each subfield is tabulated in the first error table, wherein the tabulated values correct the electronic optical axis deflected by the input from the first switch to within the desired accuracy A from the centerline of each electron beam.

9. The electron-beam lithography system of claim 8 further comprising:
- a second switch for switching between m second sources that provide inputs to a deflection system in the third section of the electronic lens system; and
- a second error DAC for correcting a position error in the input from the second switch, wherein the input from the second switch deflects the electronic optical axis to within a range from each of the centerlines of the electron beams in accordance with the following condition:

$$A \cdot 2^B = R_W,$$

wherein $R_W$ is the range within which the second switch is designed to deflect the electronic optical axis from the centerlines of each of the electron beams from the subfields in the reticle, A is the desired accuracy of the electron-beam lithography system at the wafer and B is the accuracy of the second error DAC.

10. The electron-beam lithography system of claim 9 further comprising:
- a second error table with m outputs to the second error DAC; and
- wherein the value of each input to the second switch from each of the m sources is determined from a calibration procedure in which the difference between a desired value and an actual value is tabulated in the second error table, wherein the tabulated values correct the position of the electronic optical axis deflected in the third section of the electronic lens system to within the desired accuracy A from the centerlines of the electron beam from each subfield in the reticle.

11. The electron-beam lithography system of claim 10 wherein the desired accuracy of the electron-beam lithography system at the wafer is in the range of 0.5 to 100 nanometers.

12. The electron-beam lithography system of claim 11 wherein the accuracy of the first and second error DACs is in the range of 8 bits to 18 bits.

13. An electron-beam lithography system for transferring an image from a reticle to a wafer, comprising:
- a reticle divided into subfields disposed in n rows and m columns having grillage between each subfield;
- a wafer;
- an electronic lens system disposed between the reticle and the wafer for directing an electron beam from each subfield to an appropriate position on the wafer;
- wherein the electronic lens system comprises a first section for deflecting the electron beam from each subfield to an electronic optical axis of the electronic lens system, a second section for demagnifying the electron beam and a third section for deflecting the electron beam emerging from the second section to the appropriate position on the wafer;
- a main DAC having an output corresponding to each of the m subfields in a row in the reticle;
- a first amplifier with a gain $G_1$ that amplifies the output from the main DAC that is input to a deflection system in the first section of the electronic lens system;
- a second amplifier with a gain $G_2$ that amplifies the output from the main DAC that is input to a deflection system in the third section of the electronic lens system;
- wherein the following condition is satisfied:

$$G_1/G_2 = M,$$

where M is the magnification of the electronic lens system.

14. The electron-beam lithography system of claim 13 further comprising:
- a switch for switching between m sources that correspond to the m subfields in a row of the reticle;
- a grillage error DAC for correcting a position error in the input to the switch;
- a first summer to sum an output from the switch and an output from the grillage error DAC;

a third amplifier that amplifies the output of the summer to compensate for the grillage, wherein the output of the third amplifier is input to a second summer that sums the output from the third amplifier with the output from the first amplifier.

15. The electron-beam lithography system of claim 14 wherein the accuracy of the grillage error DAC is in the range of 8 bits to 18 bits.

16. The electron-beam lithography system of claim 15 wherein the position accuracy of the electron-beam lithography system at the wafer is in the range of 0.5 to 100 nanometers.

17. An electron-beam lithography system for transferring an image from a reticle to a wafer, comprising:

a reticle divided into subfields disposed in n rows and m columns having grillage between each subfield;

a wafer;

an electronic lens system disposed between the reticle and the wafer for directing an electron beam from each subfield to an appropriate position on the wafer;

wherein the electronic lens system comprises a first section for deflecting an electronic optical axis of the electronic lens system to coincide with a centerline of the electron beam from each subfield, a second section for demagnifying the electron beam and a third section for deflecting the electronic optical axis of the electronic lens system to coincide with the centerline of the electron beam emerging from the second section of the electronic lens system;

a main DAC having an output corresponding to each of the m subfields in a row on the reticle;

a first amplifier with a gain $G_1$ that amplifies the output from the main DAC that is input to a deflection system in the first section of the electronic lens system;

a second amplifier with a gain $G_2$ that amplifies the output from the main DAC that is input to a deflection system in the third section of the electronic lens system;

wherein the following condition is satisfied:

$$G_1/G_2=M,$$

where M is the magnification of the electronic lens system.

18. The electron-beam lithography system of claim 17 further comprising:

a switch for switching between m sources that correspond to the m subfields in a row of the reticle;

a grillage error DAC for correcting a position error in the input to the switch;

a first summer to sum an output from the switch and an output from the grillage error DAC;

a third amplifier that amplifies the output of the summer to compensate for the grillage, wherein the output of the third amplifier is input to a second summer that sums the output from the third amplifier with the output from the first amplifier.

19. The electron-beam lithography system of claim 18 wherein the accuracy of the grillage error DAC is in the range of 8 bits to 18 bits.

20. The electron-beam lithography system of claim 19 wherein the position accuracy of the electron-beam lithography system at the wafer is in the range of 0.5 to 100 nanometers.

21. An electron-beam lithography system for transferring an image from a reticle to a wafer, comprising:

a reticle;

a wafer;

an electronic lens system disposed between the reticle and the wafer for directing an electron beam from the reticle to an appropriate position on the wafer;

wherein the electronic lens system comprises a first section for deflecting the electron beam from the reticle to an electronic optical axis of the electronic lens system, a second section for demagnifying the electron beam and a third section for deflecting the electron beam emerging from the second section to the appropriate position on the wafer;

a ramp generator for providing a ramp output;

a first amplifier with a gain $G_1$ that amplifies the output from the ramp generator that is input to a deflection system in the first section of the electronic lens system;

a second amplifier with a gain $G_2$ that amplifies the output from the ramp generator that is input to a deflection system in the third section of the electronic lens system;

wherein the following condition is satisfied:

$$G_1/G_2=M,$$

where M is the magnification of the electronic lens system.

22. The electron-beam lithography system of claim 21 wherein the accuracy of the electron-beam lithography system at the wafer is in the range of 0.5 nanometers to 100 nanometers.

23. An electron-beam lithography system for transferring an image from a reticle to a wafer, comprising:

a reticle;

a wafer;

an electronic lens system disposed between the reticle and the wafer for directing an electron beam from the reticle to an appropriate position on the wafer;

wherein the electronic lens system comprises a first section for deflecting an electronic optical axis of the electronic lens system to coincide with a centerline of the electron beam emerging from the reticle, a second section for demagnifying the electron beam and a third section for deflecting the electronic optical axis of the electronic lens system to coincide with the centerline of the electron beam emerging from the second section of the electronic lens system;

a ramp generator for providing a ramp output;

a first amplifier with a gain $G_1$ that amplifies the output from the ramp generator that is input to a deflection system in the first section of the electronic lens system;

a second amplifier with a gain $G_2$ that amplifies the output from the ramp generator that is input to a deflection system in the third section of the electronic lens system;

wherein the following condition is satisfied:

$$G_1/G_2=M,$$

where M is the magnification of the electronic lens system.

24. The electron-beam lithography system of claim 23 wherein the accuracy of the electron-beam lithography system at the wafer is in the range of 0.5 nanometers to 100 nanometers.

* * * * *